United States Patent
Francoeur et al.

(10) Patent No.: US 6,954,368 B1
(45) Date of Patent: Oct. 11, 2005

(54) LOW STRAY INTERCONNECTION INDUCTANCE POWER CONVERTING MOLECULE FOR CONVERTING A DC VOLTAGE INTO AN AC VOLTAGE, AND A METHOD THEREFOR

(75) Inventors: Bruno Francoeur, Beloeil (CA); Pierre Couture, Boucherville (CA)

(73) Assignee: Hydro-Québec, Montreal (CA)

( * ) Notice: Subject to any disclaimer, the term of this patent is extended or adjusted under 35 U.S.C. 154(b) by 0 days.

(21) Appl. No.: 09/147,574

(22) PCT Filed: Jun. 25, 1997

(86) PCT No.: PCT/CA97/00459

§ 371 (c)(1),
(2), (4) Date: Jan. 22, 1999

(87) PCT Pub. No.: WO98/04029

PCT Pub. Date: Jan. 29, 1998

Related U.S. Application Data

(60) Provisional application No. 60/022,259, filed on Jul. 22, 1996.

(51) Int. Cl.$^7$ ................................................. H02M 1/00
(52) U.S. Cl. ........................................ 363/144; 361/763
(58) Field of Search .............................. 361/709, 715, 361/717–720, 746, 760–763, 781, 783, 807; 363/131, 132, 141, 144

(56) References Cited

U.S. PATENT DOCUMENTS

| | | | |
|---|---|---|---|
| 4,670,833 A | 6/1987 | Sachs | 363/132 |
| 4,755,910 A | 7/1988 | Val | 361/401 |

(Continued)

FOREIGN PATENT DOCUMENTS

| | | |
|---|---|---|
| EP | 0427143 | 11/1990 |
| EP | 0621635 | 4/1994 |
| EP | 0688092 | 6/1995 |
| GB | 2261768 | 5/1993 |
| JP | 6-225545 | 8/1994 |

OTHER PUBLICATIONS

Upchurch et al., "Bus Bars Improve Power Module Interconnections," Power Conversion & Intelligent Motion: The Fusion of Power & Motion Tech & Applns., vol. 21, No. 4, pp. 1B & 22–25, Apr. '95.

Anderson et al., "Advanced Power Module using GaAs Semiconductors, Metal Matrix Composite Packaging Material, and Low Inductance Design," IEEE Int. Symposium on Power Semiconductor Devices & IC's, pp. 21–24, 1994.

Stockmeier et al., "Reliable 1200 Amp 2500 V IGBT Modules for Traction Applications," IEE Colloquium (Digest), #81, pp. 3/1–3/13, 1995.

(Continued)

*Primary Examiner*—Gary L. Laxton
(74) *Attorney, Agent, or Firm*—Foley & Lardner LLP

(57) ABSTRACT

The low stray interconnecton power converting module is for converting a DC voltage into an AC voltage. It comprises two DC voltage terminals for receiving the DC voltage, an AC voltage terminal for delivering the AC voltage, and a half-bridge including a pair of power switching elements connected as a series totem pole between the DC voltage terminals via the AC voltage terminal. It also comprises a decoupling device for decoupling the half-bridge. The decoupling device comprises a series of at least two adjacent superimposed electrode plates separated by a dielectric material and extending proximately in overlapping relation with the half-bridge. Each of the adjacent electrode plates is connected to a different one of the DC terminals. The electrode plates form with the two power switching elements, the DC terminals and the AC terminal, a reduced cross section belt-like current closed loop by which a low stray interconnection inductance power converting module is obtained.

32 Claims, 27 Drawing Sheets

U.S. PATENT DOCUMENTS

| | | | | |
|---|---|---|---|---|
| 4,907,068 A | | 3/1990 | Amann et al. | 357/74 |
| 5,031,069 A | * | 7/1991 | Anderson | 361/321.1 |
| 5,043,859 A | | 8/1991 | Korman et al. | 363/147 |
| 5,132,896 A | | 7/1992 | Nishizawa et al. | 363/144 |
| 5,142,439 A | | 8/1992 | Huggett et al. | 361/321 |
| 5,170,337 A | | 12/1992 | Borowiec et al. | 363/147 |
| 5,202,578 A | | 4/1993 | Hideshima | 257/685 |
| 5,313,363 A | | 5/1994 | Arbanas | 361/710 |
| 5,347,158 A | | 9/1994 | Matsuda et al. | 257/691 |
| 5,414,616 A | | 5/1995 | Hatozaki | 363/132 |
| 5,424,579 A | | 6/1995 | Arai et al. | 257/690 |
| 5,430,326 A | | 7/1995 | Miyashita | 257/690 |
| 5,444,295 A | | 8/1995 | Lake et al. | 257/678 |
| 5,457,604 A | | 10/1995 | Ando | 361/707 |
| 5,459,356 A | | 10/1995 | Schulze et al. | 257/773 |
| 5,471,089 A | | 11/1995 | Nagatomo et al. | 257/691 |
| 5,493,472 A | | 2/1996 | Lavene | 361/329 |
| 5,512,790 A | | 4/1996 | Lachenmaier et al. | 307/112 |
| 5,523,620 A | | 6/1996 | Eytcheson et al. | 257/690 |
| 5,528,073 A | | 6/1996 | Gilmore | 257/584 |
| 5,541,453 A | | 7/1996 | Stockmeier et al. | 257/723 |
| 5,563,447 A | | 10/1996 | Lake et al. | 257/724 |
| 5,574,312 A | | 11/1996 | Bayerer et al. | 257/706 |
| 5,616,955 A | | 4/1997 | Yamada et al. | 257/690 |
| 6,459,605 B1 | | 10/2002 | Reichard | |

OTHER PUBLICATIONS

Medaule et al., "Latest Technology Improvements of Mitsubishi Modules," IEEE Colloguium <Digest>, #146, pp. 5/1–5/5, 1996.

Shinohara et al., "A Novel Low–Profile Power Module Aimed at High–Frequency Applications," ISPSD Proceedings, 8th Int'l. Symposium on Power Semiconductor Devices and ICs, pp. 321–324, May 1996.

Takahashi et al., "Toward 99% Efficiency for Transistor Inverters," IEEE Industry Applications Magazine, vol. 2, pp. 39–46, Nov./Dec. 1996.

* cited by examiner

LOW STRAY INTERCONNECTION INDUCTANCE POWER CONVERTING MOLECULE FOR CONVERTING A DC VOLTAGE INTO AN AC VOLTAGE, AND A METHOD THEREFOR

This application claims the benefit of Provisional Application No. 60/022,259, filed Jul. 22, 1996.

BACKGROUND

In the past years, there has been a rapid growth in the power electronic industry. This industry involves the use of power electronic controlled switches. The function of these switches is to sequentially close and open a conductive link between two electrodes under the command of an electric signal. The actual technology uses semiconductor substrates to produce these switches, therefore the switching time thereof is much faster than switching time of the best mechanical relays. Because of that, the power semiconductor switch is attractive for electric power flow control. In these systems, semiconductor switches are normally grouped with passive elements in a defined configuration and connected between an electrical power source and a load or another electrical power source. Also, a series of voltage and current sensors are provided to supply information to a control unit where said information is analysed. Based upon the analysed information, switching commands are transmitted from the control unit to the switches so that large amount of electrical energy can be exchanged between sources in a controlled manner. These systems are better known as power converters.

One common application of the power converter is for driving an electrical motor. In this type of application, a DC voltage source is generally used as the power supply and a power converter is used to convert a DC voltage into polyphase AC voltage to supply and control a polyphase AC motor. These DC to AC power converters are also commonly referred as inverters.

In order to supply high power to an electrical AC motor, the power converter requires switches that can withstand high voltage and high current. In most known configuration, the power converter operates the switches in hard switching mode. In this mode, the switch goes from a blocking state to a full conducting state in two steps. In the first step, the current rises through the switch to reach the load current as there is still a blocking voltage across the switch. In the second step, the load current circulates through the switch while the blocking voltage falls until a full conduction voltage drop is reached across the switch. To go from full conducting state to a blocking state, the same steps are achieved in reverse.

During these two steps, the current-voltage product is very high and generates switching power losses within the electronic elements. These switching power losses are added to the conduction losses of the switches and they both generate heat. In order to avoid the destruction of the electronic elements, their temperature must be kept under a critical level. The cooling of the electronic components is then achieved by means of a heat exchanger joined side by side with the switching devices to release the thermal energy. The size of this heat exchanger depends directly on the amount of heat losses that is generated which itself vary proportionately with the switching frequency. On the one hand a converter operating at a low switching frequency requires a smaller heat exchanger. On the other hand, a higher switching frequency is desired to reduce the size of the filter components and the audible noise. Therefore, a compromise has to be made in the choice of the operating switching frequency. To reduce the size of the heat exchanger and the filter components, to reduce the noise, and to increase the efficiency of the power converter, the conduction and the switching losses have to be reduced.

The today most commonly used switching elements in power converters are gate capacitance transistors like Mosfets, IGBTs or MCTs because they are easy to operate. The conduction losses of these switching elements are in relation with their physical properties, with their size and with the fact that several of them can be mounted in parallel. Accordingly little or nothing can be done for reducing these conduction losses by acting on the way the switching elements are controlled. For example, it is not possible to act upon the conduction losses of Mosfets or IGBTs by working upon their control when their gate input capacitance is fully charged. But it is possible to reduce switching losses in cases where the switches are operated in such way that one can still act upon the switching losses by working on the way the switches are controlled. Thus, the switching losses can be further reduced by increasing the switching speed with the proper electrical adjustment such as an appropriate choice of a gate resistor for an IGBT or Mosfet. However, the power electronic switching devices are then submitted to high transient voltage spikes caused by abrupt changes in the current that flows through the stray interconnection inductance located within the power converter assembly. These voltage spikes are added to the bus voltage. A voltage combining the voltage spikes and the bus voltage are then applied across the switch during the turn-off phase. If the magnitude of the voltage spike becomes too high, the switching electronic elements within the power converter may be destroyed. In addition, the voltage spike generates noise that affects other components in the circuit through the stray capacitance elements and it also adds to the EMI (Electromagnetic Interference) problem.

Also, just before the turn-off phase, it should be noted that the energy stored in the magnetic field of the stray interconnection inductance will have to be released. This energy is eliminated through heat losses within the switches. In an article entitled "Losses due to stray Inductance in Switch Mode converters", by M. Fasching and published in EPE Journal, volume 6, No. 2, pages 33–36 of September 1996, it is explained that additional power losses in a converter can be linked to the stray interconnection inductance when the switched-on current is different from the switched-off current in the same period, these losses contributing significantly to the total losses of the power converter.

In order to reduce the voltage spike and to reduce the switching losses of the converter, different techniques may be applied.

First, a clamping device may be connected across the switches to suppress the voltage spike during their turnoff phase. In doing so, the clamping device diverts and keeps the energy that was stored in the stray interconnection inductance just before the turn-off phase. It should be noted that when the clamping device is in operation, the switch does not control anymore the falling rate of the current. This falling rate depends on the voltage applied on the stray interconnection inductance and depends on the value of the stray interconnection inductance. The value of this voltage is representative of the amplitude of the voltage spike that can be withstood. Also, when the clamping device is in operation, energy is pumped out from the DC supply source into the clamping device. Thereby, the addition of a clamping device increases turn-off losses and the switch looses its control on the falling rate of the current. The more the voltage spike is suppressed, the higher the amount of energy to be disposed of by the clamping device is. If this energy is eliminated through heat losses, then it affects the efficiency of the power converter. According to recent developments in the state of the art, clamping devices containing additional components to return the trapped energy back into the DC voltage supply source are used. Then, the efficiency is not affected but the system is much more complex.

Secondly, instead of increasing the turn-off speed of the switches which causes voltage spikes, energy recovery snubbers may be used to absorb high switching losses and return this energy to the supply source. Then, the frequency at which the source voltage is switched can be increased. Thus, the efficiency of the converter is improved and voltage spikes are limited, but the current falling rate is still not controlled by the switch. In the article entitled "Toward 99% Efficiency for. Transistor Inverters" by I. Takahashi and al., published in IEEE Industry Applications Magazine, Volume 2, pages 39–46 of November/December 1996, there is shown the use of an energy recovery snubber circuit to improve the efficiency of the converter as mentioned above.

Both of the techniques described above improve the power converter but they add components to the circuit whereby increasing the complexity of the whole assembly.

If the use of clamping devices or snubbers is not desired in applications where voltage spikes cannot be suppressed, it is therefore necessary to use high voltage power electronic switching devices that can support the bus voltage plus the voltage spike during the turn-off phase. Unfortunately, this solution misuses the power switching capability of the device, requires bigger assembly to operate with the larger semiconductor chips and produces higher conduction losses because the size of the chips that are used and their conduction losses both increase with its voltage withstand capability. It is therefore strongly desired to reduce the stray interconnection inductance within the power converter assembly to reduce the magnitude of voltage spikes imposed on the switching devices, to increase the switching speed, to avoid the use of clamping devices or snubbers, to control the current falling rate by means of the switch, to reduce the losses associated with the stray interconnection inductance itself, and to reduce the size of the power converter.

The small stray interconnection inductance is obtained with good wiring structure within the converter. In large module, several semiconductor chips are mounted in parallel to increase the current switching capability. The wiring of these semiconductor chips has to be done in a specific manner to prevent oscillations. Bad wiring produces oscillations between the chips during turn-on and turn-off phases because of the stray interconnection inductance that links all of the chips. This problem must be considered in the design of a new module.

Known in the art, there are U.S. Pat. Nos. 5,616,955, 5,574,312, 5,563,447, 5,541,453, 5,523,620, 5,512,790, 5,471,089, 5,459,356, 5,457,604, 5,444,295, 5,424,579, 5,347,158, 5,170,337, 5,043,859, 4,907,068, UK patent No. 2 261 768 and European patents Nos. 621 635, 427 143, and articles entitled "A Novel Low-Profile Power Module Aimed at High-Frequency Applications", published in the ISPSD Proceedings, 8$^{th}$ International Symposium on Power Semiconductor Devices and Ics, pages 321–324 of May 1996; "Latest technology Improvements of Mitsubishi Modules", published in IEE Colloquium (Digest), #146, P.5/1–5/5 1996; "Reliable 1200 Amp 2500 V IGBT Modules for Traction Applications", published in IEE Colloquium (Digest), #81, pages 3/1–3/13 1995; and "Advanced Power Module using GaAs Semiconductors, Metal Matrix Composite Packaging Material, and Low Inductance Design", published in IEEE International Symposium on Power Semiconductor devices & IC's, pages 21–24, 1994.

In these documents, different embodiments are proposed to reduce the stray interconnection inductance within the internal part of a package that contains one or more semiconductor switching devices. However, these documents do not teach nor show how to reduce the stray interconnection inductance resulting from the wiring that connects each package to two DC voltage terminals decoupled by a capacitor.

Also known in the art are U.S. Pat. Nos. 5,430,326, 5,202,578, where modules with particular external connecting means arrangements are proposed for power semiconductor devices. With these modules, a power converter assembly is provided with bus bars and modules having interconnections length reduced to a minimum, thus reducing the stray interconnection inductance outside these modules. These patents do not teach nor show how the stray interconnection inductance within the module can be reduced.

Also known in the art is an article entitled "Bus Bars Improve Power Module Interconnections", published in Power Conversion & Intelligent Motion: The Fusion of Power & Motion Technology & Applications, volume 21, number 4, pages 18–25, April 1995. In this article, a wiring technique is presented which employs laminated bus bars to interconnect power modules and the capacitor in converter assemblies. Using this technique, a low stray interconnection inductance is realized. However, this document do not teach nor show how the stray interconnection inductance within the module can be reduced.

Also known in the art are U.S. Pat. Nos. 5,528,073, 5,493,472, 5,414,616, 5,313,363, 5,142,439, 5,132,896 and Japanese patent No. 6225545. These patents disclose power converter assemblies each built with the manufacturer's power semiconductor switching modules, particular terminal links and a capacitor. These assemblies are made with short conductive interconnections having a particular arrangement so that the interconnection inductance outside of the modules, and including the capacitor, is low. An overall low interconnection inductance is achieved with these assemblies but these patents do not teach nor show how the stray interconnection inductance within the module can be reduced.

All of the above mentioned patents and documents give only a partial solution for reducing interconnection inductance.

Also known in the art is U.S. Pat. No. 4,670,833. In this patent, the complete topology of a power converter circuit is disclosed. The inventor discloses a new switching module provided with connecting means and arranged with a pair of DC terminals made of two layer conductive plates separated by an insulating layer and connected directly on the switching module thus reducing the stray interconnection inductance. An overall low stray interconnection inductance is achieved when a smoothing capacitor is connected directly on the two layer conductive plates. In this patent, the module containing the semiconductors switches, the capacitor and the DC terminals are not part of a unique package.

Also known in the art is U.S. Pat. No. 4,755,910, describing a packaging unit for encapsulating electronic circuitry. This invention is a circular electronic circuit board provided with a plurality of studs and at least one central opening. The studs are divided into two groups, a first group being located at the periphery of the circuit board, and a second group being located at the periphery of the central opening. Also, a multi-layer capacitor forms a cover superimposed on top of the circuit. This capacitor brings the supply voltage to the electronic circuit board via the two groups of studs. With this particular arrangement, the supply voltage travels along a distance that is at the most only the half of the distance travelled by the supply voltage in an electronic circuit board with the same area, its two supply voltage electrodes being located side by side at the periphery of the electronic circuit board. The wire inductance and the wire resistance are therefore reduced for each travelled path in the circuit lines. This invention is an improvement for electronic integrated circuit that uses multiple signal lines for logic transmission where a single wire inductance can cause noise that interferes with the logic level interpretation. However, this invention does not teach nor show how to provide a low interconnection inductance power converting module.

SUMMARY OF THE INVENTION

Accordingly, it is an object of the present invention to provide a low stray interconnection inductance converting module and a method for converting a DC voltage into an AC voltage, where the power switching devices, the DC terminals, an AC terminal and the decoupling capacitor are located within a unique package, and with a stray interconnection inductance that is lower than the one obtained with apparatus and method of the prior art.

According to the present invention, there is provided a low stray interconnection inductance power converting module for converting a DC voltage into an AC voltage, comprising:

two DC voltage terminals for receiving the DC voltage;

an AC voltage terminal for delivering the AC voltage;

a half-bridge including a pair of power switching elements connected as a series totem pole between the DC voltage terminals via the AC voltage terminal; and a decoupling means for decoupling the half-bridge, the decoupling means comprising a series of at least two adjacent superimposed electrode plates separated by a dielectric material and extending proximately in overlapping relation with the half bridge, each of the adjacent electrode plates being connected to a different one of the DC terminals, the electrode plates forming with the two power switching elements, the DC terminals and the AC terminal a reduced cross section belt-like current closed loop by which a low stray interconnection inductance power converting module is obtained.

According to the present invention, there is also provided a method for converting a DC voltage into an AC voltage, comprising:

applying the DC voltage on two DC voltage terminals between which a half-bridge is connected, the half-bridge including a pair of power switching elements connected as a series totem pole between the DC voltage terminals via an AC voltage terminal;

alternately switching the power switching elements;

decoupling the half-bridge by means of a decoupling means comprising a series of at least two adjacent superimposed electrode plates separated by a dielectric material and extending proximately in overlapping relation with the half bridge, each of the adjacent electrode plates being connected to a different one of the DC terminals, the electrode plates forming with the two power switching elements, the DC terminals and the AC terminal a reduced cross section belt-like current closed loop; and delivering the AC voltage by means of the AC voltage terminal.

The objects, advantages and other features of the present invention will become more apparent upon reading of the following non restrictive description of preferred embodiments thereof given for the purpose of exemplification only with reference to the accompanying drawings.

DETAILED DESCRIPTION OF THE DRAWINGS

Figure 1:
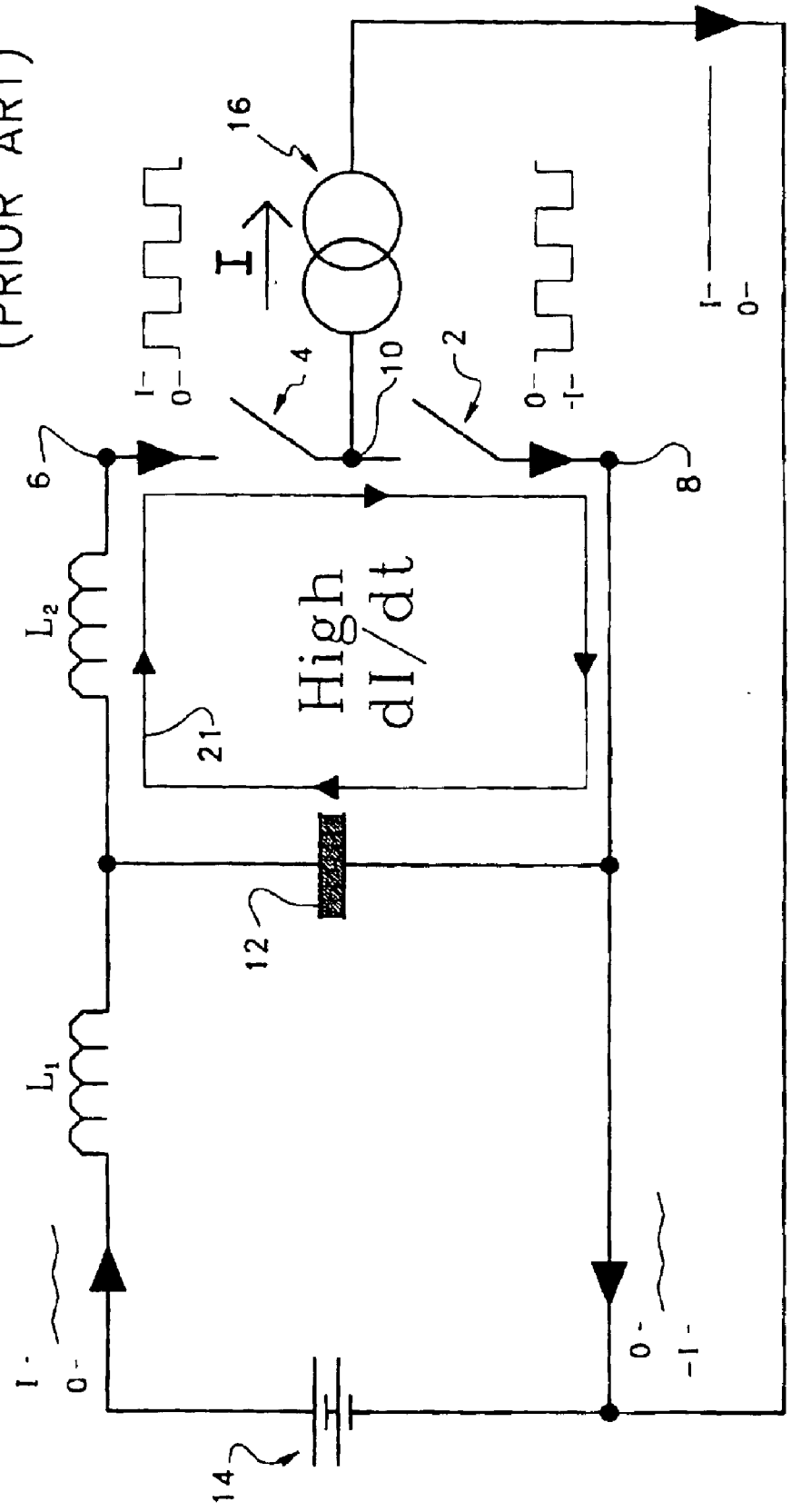
FIG. 1 is a schematic circuit diagram of a DC to AC power converter known in the art.

Referring now to FIG. 1, there is shown the basic topology of a single phase DC to AC power converter, as known in the prior art. It is composed of two power electronic switches 2 and 4 mounted in a totem pole configuration. This power converter is also known as a half bridge configuration. The switches 2, 4 have ends connected respectively to the DC terminals 6, 8 and also ends linked together at the terminal 10 (also referred to as center point herein after). A terminal is defined as a junction point where electrical components are electrically connected to. A capacitor 12 and a DC voltage source 14 are connected in parallel, between the DC terminals 6 and 8. $L_1$ and $L_2$ are stray wiring inductances. A DC current source 16 with a current amplitude I has one end connected the centre point 10 and the other end connected to the negative electrode of the DC voltage source 14. An AC voltage is generated at the centre point 10 when the switches 2 and 4 are alternatively opened and closed. The two switches 2 and 4 are alternatively closed and opened in a predetermined sequence to obtain the desired AC voltage magnitude and harmonic content. In polyphase applications, polyphase voltages are generated by means of multiple half bridges connected in parallel to the terminals 6 and 8 with their respective centre point linked to their own load. During the operation of the power converter, a voltage is induced in the stray interconnection inductance $L_1$, $L_2$ of the circuit due to the abrupt current change in the switches 2, 4.

Figure 2:
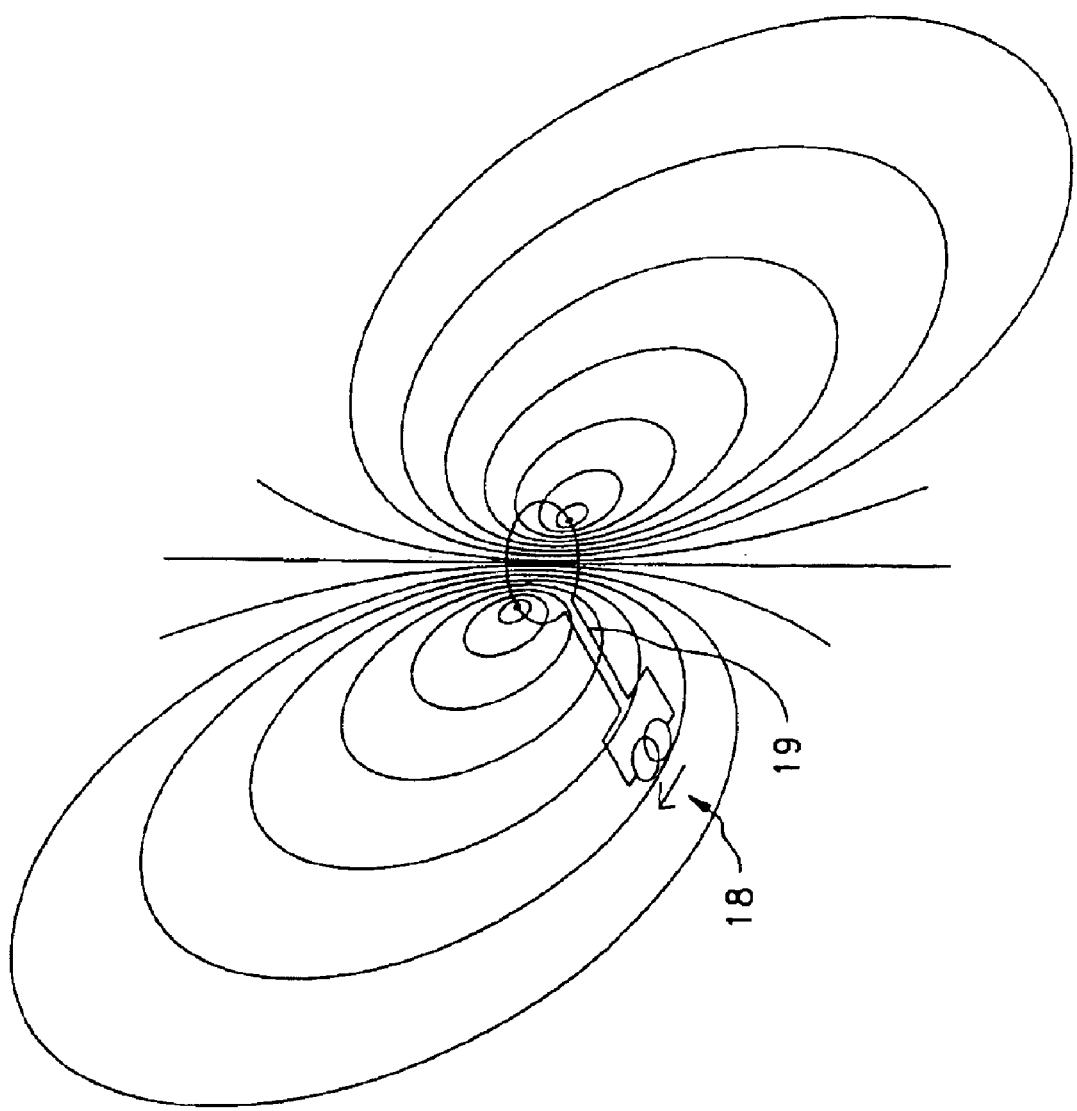
FIG. 2 is a schematic diagram showing the resulting magnetic flux of an electrical current flowing through a closed loop, used in support of explaining the present invention.

Referring now to FIG. 2, the phenomenon discussed above is shown. A single current 18 flowing in a closed loop 19 produces a magnetic flux 4 which is defined by:

$$\Phi = L \cdot I$$

where I is the current and L is called the self-inductance of the circuit and depends solely on the geometry of the circuit. A change in the current flowing in the circuit produces within this circuit an induced voltage equal to LdI/dt that is added to other voltages already present in the loop 19.

Therefore, the stray interconnection inductance within the power converter assembly responsible for the voltage spike depends on the geometry of the circuit assembly. To locate the stray interconnection inductance in the power converter, an analysis of the switching sequences must be achieved to measure its impact on the current distribution in all the nodes of the circuit.

Referring back to FIG. 1, when the power converter is in operation, the current I of the source 16 follows two different paths. As an approximation, the current I of the source 16 is considered constant to reflect the behaviour of an inductive load having a time constant much higher then the switching period like, for example, the inductance of one phase of a motor. When the switch 2 is closed and the switch 4 is opened, the current I flows through the terminal B. When the switch 4 is closed and the switch 2 is opened, the current I flows through the terminal 6. In between these two conditions, both switches 2, 4 are in a commutation state. During this commutation state, a positive (or negative) current flowing through one of the terminals 6, 8 drops as a negative (or positive) current flowing through the other terminal 6 or 8 rises, so that the sum remains equal to I. A positive current is viewed as a current flowing through the corresponding switch 2, 4 from top to bottom. During the commutation state, a current change dI/dt of same amplitude and sign occurs in the switches 2 and 4 and trough the terminals 6, 8 and 10. The faster this commutation state, the higher the current change rate in both switches 2 and 4 and terminals 6, 8 and 10 is.

In general, the voltage source 14 is not located in proximity of the power converter. Therefore, a capacitor 12 is connected across the terminals 6, 8 near the two switches 2, 4 so that a high current change does not flow in the stray interconnection inductance $L_1$ between the source 14 and the power converter. The high changing current flowing through the terminals 6, 8 follows a closed loop path 21 through the capacitor 12 which behaves as a short-circuit. The voltage source 14 produces only DC with very low harmonic currents. Therefore only a very low voltage is induced in the interconnection inductance $L_1$ between the voltage source 14 and the capacitor 12. This high current change dI/dt responsible for the voltage spike is thereby imposed on the current closed loop path 21 that flows through the switches 2 and 4, through the terminals 6, 8 and 10 and through the capacitor 12. The magnitude of this induced voltage spike depends on the stray interconnection inductance $L_2$ formed by the geometry of the closed loop path 21. In addition, this induced voltage spike is added to the voltage of the capacitor 12 and is applied across either switch 2 or 4 during turn-off phase. The induced voltage relates to the current change as shown in the following equation:

$$V = L_2 dI/dt.$$

The object of the present invention is to provide a compact power converter assembly in one unique package that includes the half bridge power electronic switching devices, the DC terminals, the AC terminal and the capacitor. This compact power converter assembly should have a reduced overall stray interconnection inductance $L_2$ to reduce the transient voltage spike imposed on the switches 2, 4, allow higher switching speed, avoid using clamping devices or snubbers, allow a control of the current falling rate by means of the switch, allow several switching devices to be mounted in parallel, reduce the losses due to the stray interconnection inductance $L_2$ itself, and reduce the size of the converter.

Figure 3:
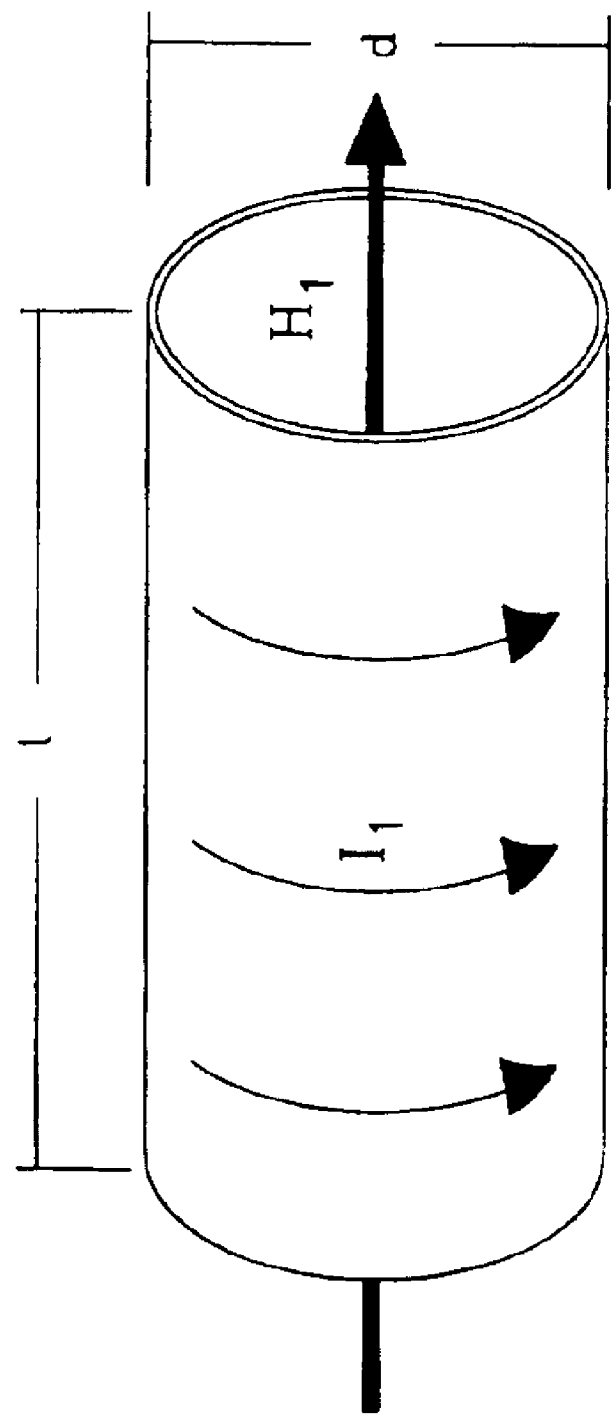
FIG. 3 is a schematic diagram showing the resulting magnetic field of an electrical current flowing through a cylindrical conductor, used in support of explaining the present invention.

Referring now to FIG. 3, there is shown a cylindrical conductor of diameter d and length l. A current loop $I_1$ uniformly distributed in a belt-like fashion on the periphery of the cylinder produces a magnetic field $H_1$ along its central axis, which generates the self inductance. For l>0.2d, the following equation gives the inductance value with less than 3% error:

$$L = \frac{2.2d^2}{d+2.21} \cdot 10^{-6} \text{ Henry,} \quad (1)$$

where l and d are in metres. This equation is shown in "Electrotechnique", $2^{nd}$ edition, page 230, by Theodore Wildi, Les presses de l'Université Laval. For example, if we put in equation (1) values of d and l that are representative of current module size known in the art, we obtain a resulting inductance of a few $10^{-9}$ Henry. The present invention reduces the stray interconnection inductance by providing a reduced cross section belt-like current path in the converter module assembly during the switching phases.

Figure 4:
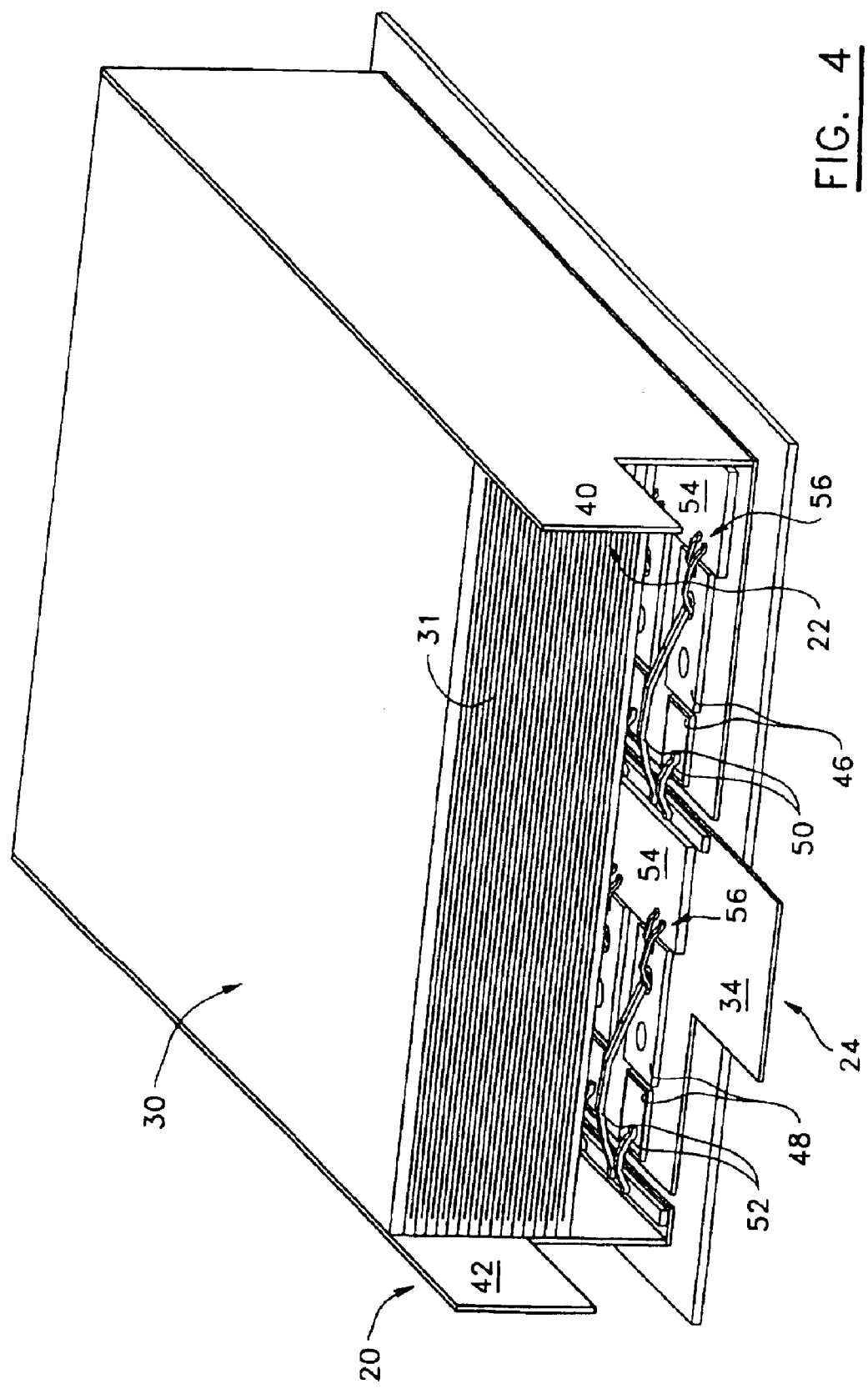
FIG. 4 is a schematic perspective view of a power converting module in accordance with the present invention.
Figure 5:
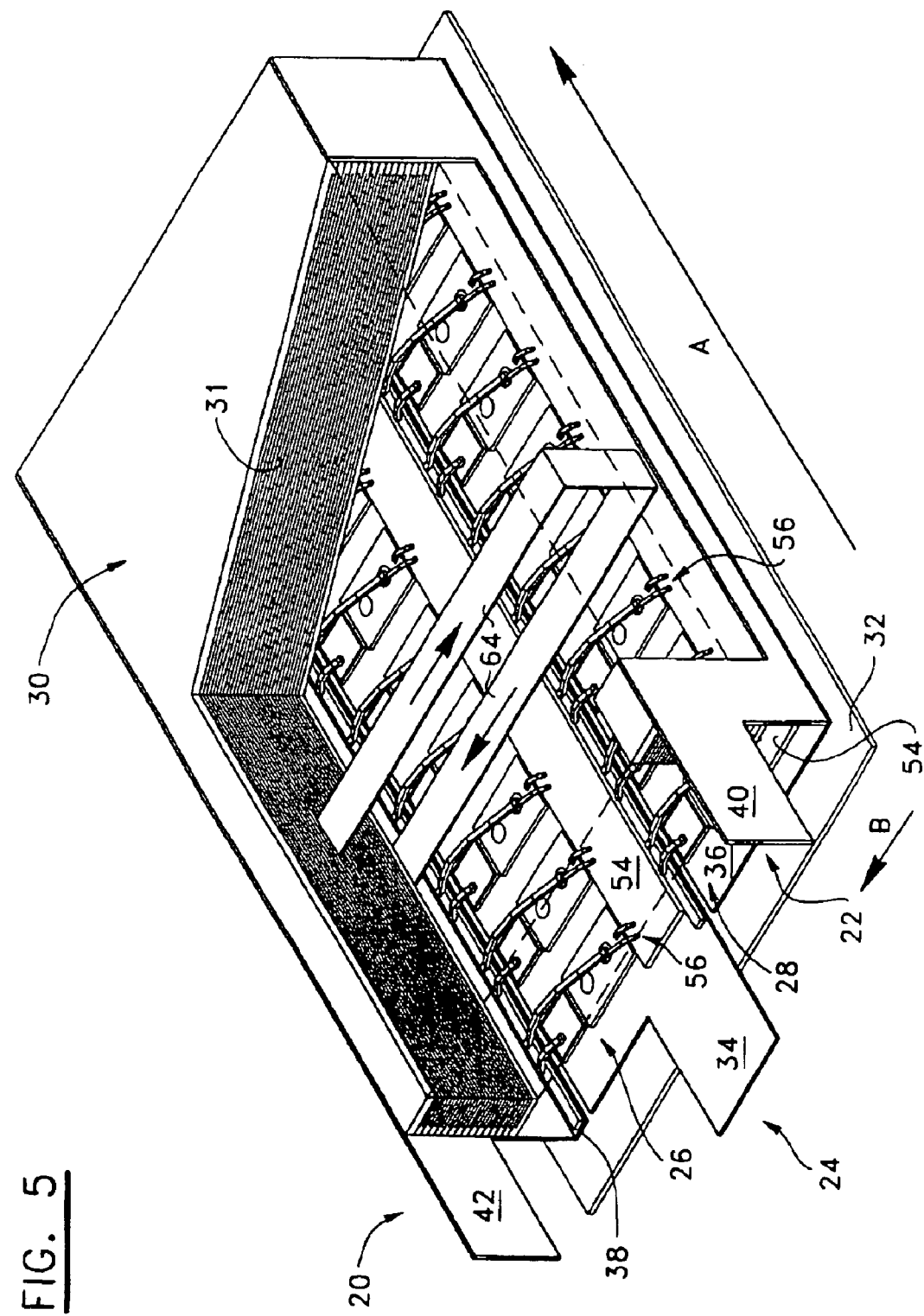
FIG. 5 is a schematic perspective view of the power converting module shown in FIG. 4 with cut parts to show an interior portion thereof.

Referring now to FIGS. 4 and 5, there are shown respectively a perspective view of a power converter module which provides a belt-like current path in accordance with the present invention, and the same module with cut parts to expose an interior portion thereof.

The low stray interconnection inductance power converting module is for converting a DC voltage into an AC voltage. It comprises two DC voltage terminals 20 and 22 for receiving the DC voltage, and an AC voltage terminal 24 for delivering the AC voltage. There is also provided a half-bridge including a pair of power switching elements 26 and 28 connected as a series totem pole between the DC voltage terminals 20 and 22 via the AC voltage terminal 24. There is a decoupling device 30 for decoupling the half-bridge. The decoupling device 30 comprises a series of at least two adjacent superimposed electrode plates 31 separated by a dielectric material and extending proximately in overlapping relation with the half bridge. Each of the adjacent electrode plates 31 is connected to a different one of the DC terminals 20 and 22. The electrode plates 31 form with the two power switching elements 26 and 28, the DC terminals 20 and 22, and the AC terminal 24 a reduced cross section belt-like current closed loop 64 by which a low stray interconnection power converting module is obtained. The superimposed electrode plates 31 form a capacitance.

Preferably, the power converting module comprises a base 32 made of ceramic material, onto which the power switching elements 26 and 28 are mounted. Each of the power switching elements 26 and 28 includes a row of power semiconductor devices mounted in parallel. The AC terminal 24 includes a central metal plate 34 mounted on the base 32. Each of the two DC voltage terminals 20 and 22 includes a lateral metal plate 36 or 38 mounted onto the base 32, and a lateral upright metal wall 40 or 42 connected between the-corresponding lateral metal plate 36 or 38 and the decoupling device 30. The power switching elements 26 and 28 are connected as a series totem pole between the lateral metal plates 36 and 38 of the DC voltage terminals 20 and 22 via the central metal plate 34 of the AC voltage terminal 24.

Preferably, each row of power semiconductor devices comprises MOSFETS, IGBTs and/or diodes. The module further comprises drivers 54 mounted on the base 32 nearby the MOSFETs or IGBTs, to bring the gate signal to the MOSFETs or IGBTs. In the present description, a driver is defined as a board provided with electronic components for supplying through output connecting pads an analog gate signal to the gate of the semiconductor chips. Preferably, the reduced cross section belt-like current closed loop is defined by the central plate 34, the lateral metal plates 36 and 38, the lateral upright metal walls 40 and 42, the superimposed electrode plates 31 and the switching elements 26 and 28. This belt-like current closed loop has a rectangular cross section.

In operation, the method for converting a DC voltage into an AC voltage, comprises the step of applying the DC voltage on two DC voltage terminals 20 and 22 between which a half-bridge is connected, the half-bridge including a pair of power switching elements 26 and 28 connected as a series totem pole between the DC voltage terminals 20 and 22 via an AC voltage terminal 24.

Then there are the steps of alternately switching the power switching elements 26 and 28, and decoupling the half-bridge by means of a decoupling device 30 comprising a series of at least two adjacent superimposed electrode plates 31 separated by a dielectric material and extending proximately in overlapping relation with the half bridge, each of the adjacent electrode plates 31 being connected to a different one of the DC terminals 20 and 22. The electrode plates 31 form with the two power switching elements 26 and 28, the DC terminals 20 and 22, and the AC terminal 24 a reduced cross section belt-like current closed loop. Finally, there is a step of delivering the AC voltage by means of the AC voltage terminal 24.

The plates 36, 38 and 34 are conductive strips provided on the base 32 which is made of an insulating substrate, such as an alumina or aluminum-nitride. The strips are placed in parallel and along direction A. A first row of semiconductor chips 46 and a second row of semiconductor chips 48, such as Mosfets, IGBTs and/or diodes, are mounted respectively on the surface of the conductive plates 36 and 34. The semiconductors chips 46 and 48 are electrically linked with their respective conductive plates 36 and 34. Furthermore, the surface connecting pads of the first rows of semiconductor chips 46 are electrically linked with bounding wires 50 to the conductive plate 34. The connecting pads of the second rows of semiconductor chips 48 are electrically linked with bounding wires 52 to the conductive plate 38. Also, driver boards 54 made with insulating substrate, such as alumina, are placed in proximity of the chips to provide gate signals trough the bounding wires 56. Thus, the whole assembly constitutes a half bridge power converter circuit.

A series of superimposed horizontal conductive plates 31, separated with dielectric material such as a ceramic, are mounted with a minimum distance on top of the insulating substrate 32. This minimum distance leaves place for the bounding wires 50 and 52. Furthermore, only one edge of each conductive plates 31 is connected to either the upright wall 40 or to the upright wall 42, the sequence of the edge connection alternating from one of the plates 31 to the next.

Hence, the assembly of the plates 31 forms a capacitor. This capacitor is directly connected in parallel to the half bridge power converter mounted thereunder.

The terminal 22 is for receiving the first electrode of a bipolar DC voltage source (not shown). The terminal 20 is for receiving the second electrode of the bipolar DC voltage source. The terminal 24 is for connection with a load (not shown). Thereby, the whole assembly supplies AC voltage to the load via the operation of the half bridge power converter. The locations of the connecting points on the terminals 20, 22 and 24 are not critical in the power converter and can be made where it would be most convenient for electrical, mechanical or assembly purposes.

The module of the present invention comprises several parallelled half bridge converters each made of two semiconductor chips 46 and 48 mounted in a totem configuration. Each of the semiconductor chips 46 and 48 is made of a diode chip connected in parallel to a IGBT chip. These half bridge converters are disposed in parallel along direction A to increase current capability. The capacitor 30 is connected directly across all parallelled half bridge converters. Thus, direct decoupling of all of the half bridge converters is obtained, and possible oscillations between adjacent half bridge converters during turn-on or turn-off phase because of stray interconnection inductances are avoided. Furthermore, the positions and the boundings of the chips 46, 48 are done to obtain a uniform distribution of the current along direction A. Thus, the transient current loop path are oriented along direction B. In addition, the capacitor made by the plates 31 acts as a short-circuit for transient currents, so that the current change occurring during a switching sequence of the power converter follows a belt-like path 64 similar to the tubular geometry shown in FIG. 3.

Consequently, this assembly has a stray interconnection inductance substantially equivalent to the inductance of a cylinder coil having the same cross section area and length. This stray interconnection inductance is very low thereby reducing the voltage spike generated across the switching elements 26, 28, allowing higher switching speed, avoiding the use of clamping devices or snubbers, allowing a control of the current falling rate by means of the switch, allowing several switching devices to be parallelled, reducing the losses due to the stray interconnection inductance $L_2$ itself, and reducing the size of the converter.

Figure 6:
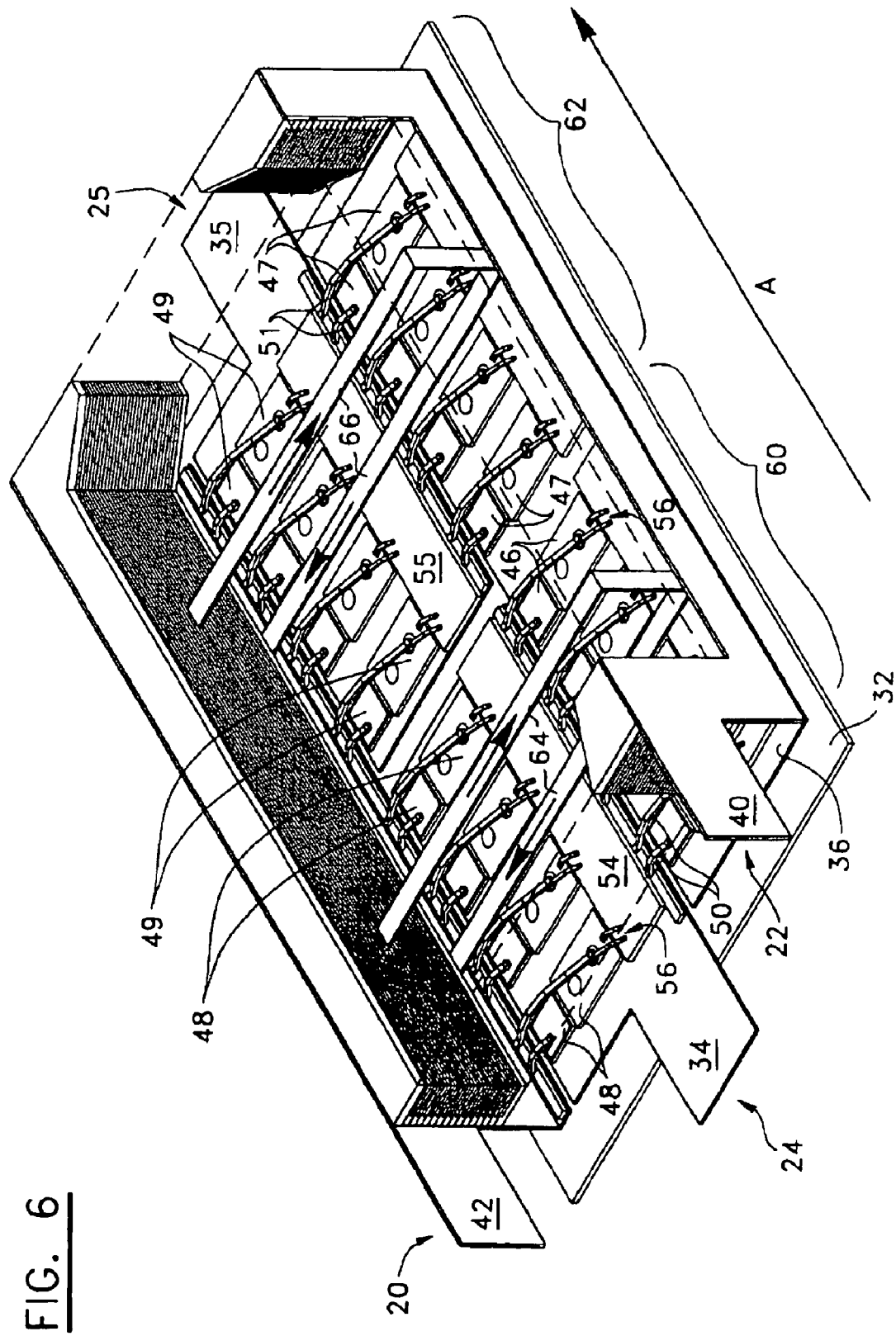
FIG. 6 is a schematic perspective view of a power converting module according to the present invention, with cut parts to show interior thereof.

Referring now to FIG. 6, there is shown a cut view in perspective of another embodiment of the present invention. Instead of a single terminal 24 as shown in FIGS. 4 and 5, two terminals 24 and 25 including respectively plates 34 and 35 are mounted side by side on the insulating substrate 32 along direction A. A first half 60 of the row of semiconductor chips 48 is mounted on the plate 34. A second half 62 of the row of semiconductor chips 49 is mounted on the plate 35. Furthermore, the bounding wires 50 of the first half 60 of the row of semiconductor chips 46 mounted on plate 36 are electrically connected to the plate 34 and the bounding wires 51 of the second half 62 of the row of semiconductor chips 47 mounted on plate 36 are electrically connected to the plate 35. Also, two groups of driver boards 54 and 55 are placed respectively in proximity to their group of chips 48, 49 to provide gate signals trough the bounding wires 56. Thereby this whole assembly now has two half bridge power converters.

The terminals 24 and 25 are for connection with the two end terminals of one load (not shown) or the first end terminal of two loads (not shown) with their other end terminal connected to one of the voltage source electrode. Thus two AC voltages are supplied to the loads by means of two half bridge power converters. In operation, these two half bridge power converters produce transient current belt-like paths 64 and 66 similar to what is shown in FIG. 3. With this assembly, the stray interconnection inductance $L_2$ for each half bridge is equivalent to the inductance of a cylinder coil having the same cross section area and length, this stray interconnection inductance being very low, hence reducing the voltage spike generated across the switches, allowing higher switching frequency and reducing the losses relating to the stray interconnection inductance itself. The locations of the connecting points on the terminals 24 and 25 are not critical in the power converter and can be made where it would be most convenient for electrical, mechanical or assembly purposes. The present embodiment can be easily adapted for more than two half bridge power converters.

Figure 7:
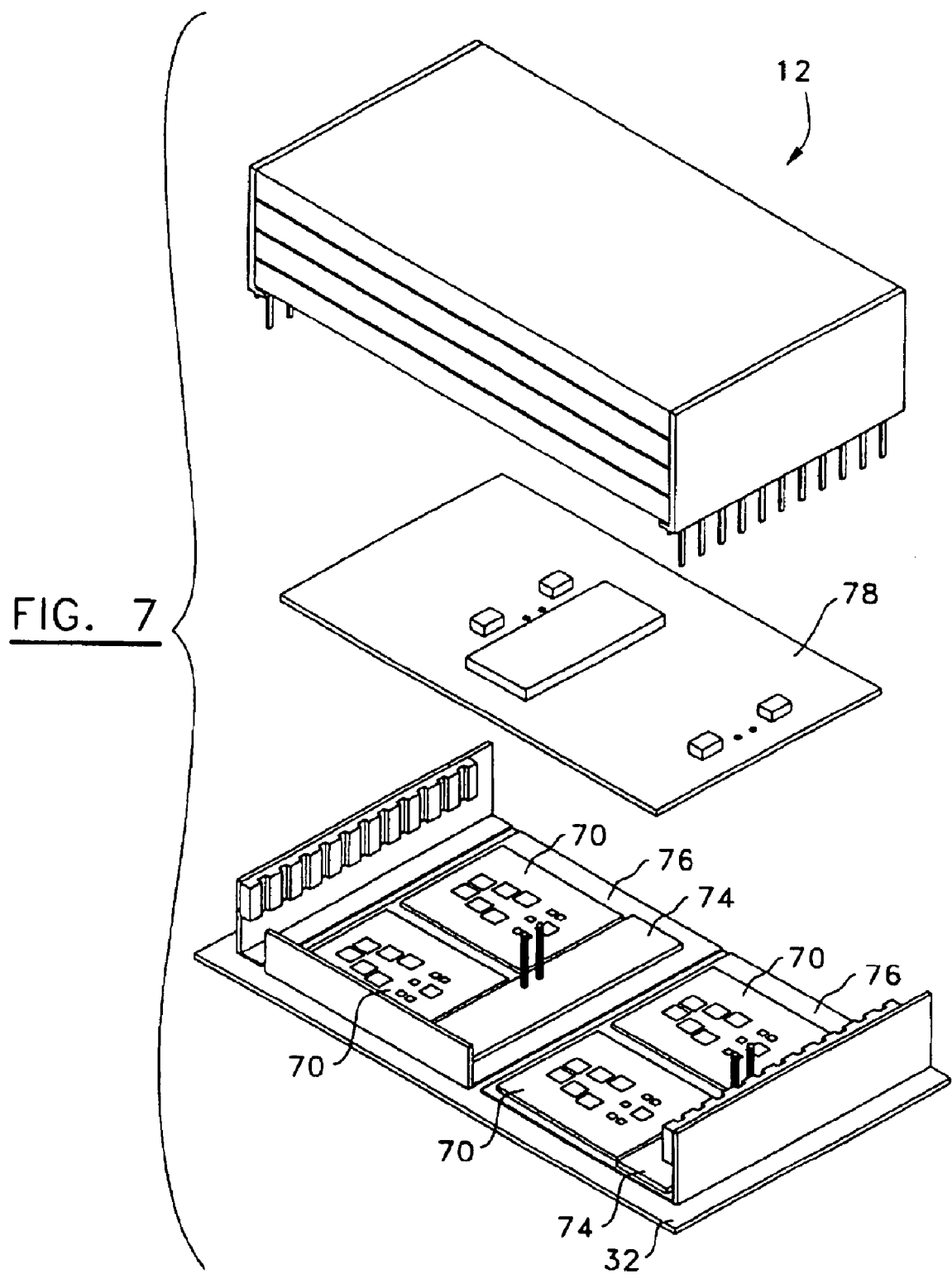
FIG. 7 is a schematic perspective exploded view of a power converting module according to the present invention.
Figure 8:
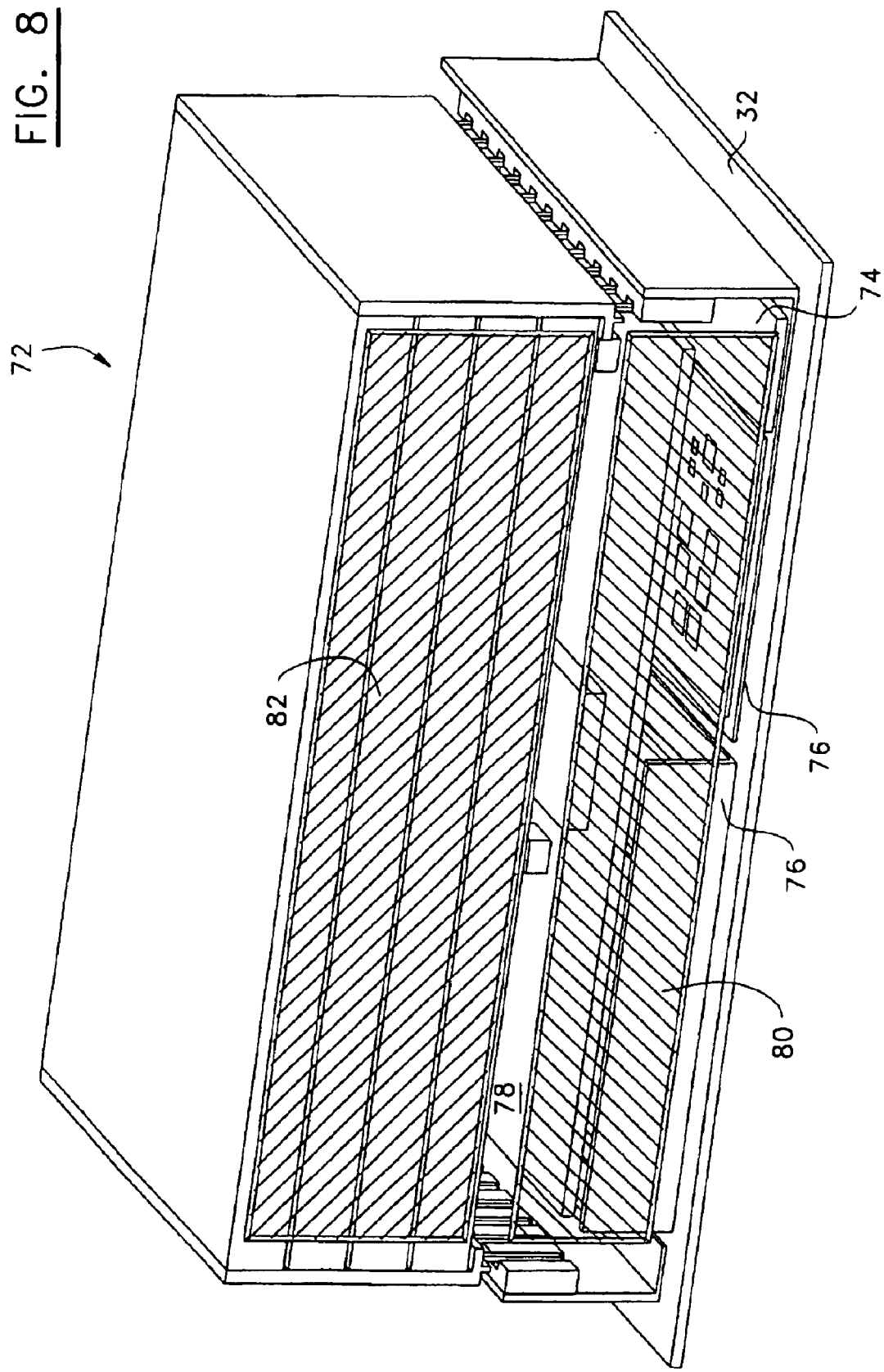
FIG. 8 is a schematic perspective side view of the power converting module shown in FIG. 7 in an assembled position.

Referring now to FIGS. 7 and 8, there are shown in detail a power converter module built in accordance with the present invention. In these figures, the bounding wires and the details of the low power electronic circuit boards are omitted to not overload them. FIG. 7 is a disassembled view of the module, and figure a is an assembled view of the same module. Four large power Mosfet chips 70 with built in free wheel diodes are used as semiconductor chips. These chips 70 are characterized by ultra fast turn off speed capability. The insulating substrate 32 is made of alumina. A multi layer ceramic capacitor 72 is mounted on top of the assembly. Thereby the whole assembly forms one half bridge power converter similar to the one shown in FIG. 4. Two gate drivers 74 are mounted on conductive plates 76, in close proximity to the power Mosfets chips 70.

A control board 78, operating with the drivers 74 is inserted in a gap located underneath the capacitor 72 when the module is assembled. The control board 78 comprises digital and analog components such as a micro-controller with sensors and amplifiers ; digital inputs/outputs to be linked with a master controller ; and analog outputs to drive the semiconductor chips via the drivers 74. A number of conductive links electrically connect the control board 78 to the drivers 74 so that gate control signals are provided to the power Mosfets 70 via the driver 74 and the control board 78. The control board 78 supports the analog and the logic circuit not required on the ceramic base, thus reducing significantly the size of the substrate 32. The increase of the gap to insert the control board 78 has less impact on the stray interconnection inductance compared to the impact resulting from an increase of the substrate surface along direction B. This control board 78 is not shown in the previous figures to not overload them. The numbers 80 and 82 indicate cross section surfaces that will be referred to later in the description.

Figure 9:
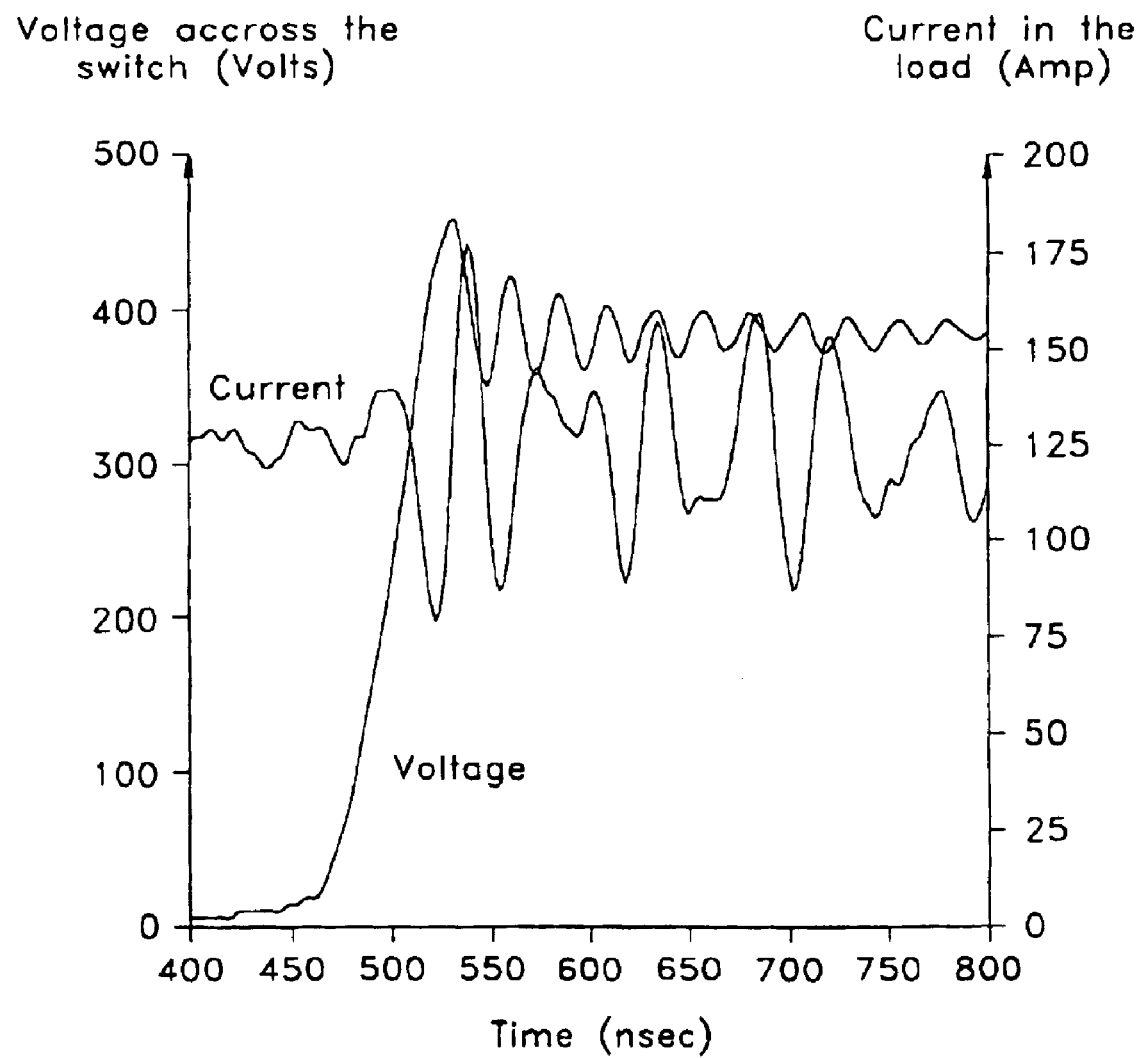
FIG. 9 is a diagram showing, in relation to the module of FIGS. 7 and 8, the voltage across a switch and the current in a load, with respect to time.

Referring now to FIG. 9, there is shown the voltage measured directly across one row of the Mosfet chips 70 shown in FIGS. 7 and 8 during a turn off sequence of the current flowing through the Mosfet chips 70. The cutoff current is at 125 amperes and is coming from an inductive load while the operating bus voltage is at 400 volts. It can be observed that the voltage has a spike with a ringing decay caused by the oscillation of a stray interconnection inductance $L_2$ that is in series with the output capacitance of the Mosfet chips supporting the voltage. The energy contained within the oscillation is eliminated by joule effect in the resistive links. The stray interconnection inductance $L_2$ can be evaluated by means of the damping frequency and a $2^{nd}$ order equation of the series resonant LCR circuit. The damped frequency can be calculated with the following equation:

$$f_{damped} = \frac{1}{2\pi\sqrt{L_2 C}}\sqrt{1-z^2}, \tag{2}$$

where z is a damping factor and has a value within the interval $0 \leq Z \leq 1$. Without evaluating z, we can modify the equation to get:

$$f_{damped} \leq \frac{1}{2\pi\sqrt{L_2 C}}. \tag{3}$$

We can change the equation to:

$$L_2 \leq \frac{1}{4\pi^2 \, C \, f_{damped}^2}. \quad (4)$$

The damped frequency of the voltage shown in FIG. 9 is about 40 Mhz, and the voltage oscillates around 400 volts.

Figure 10:
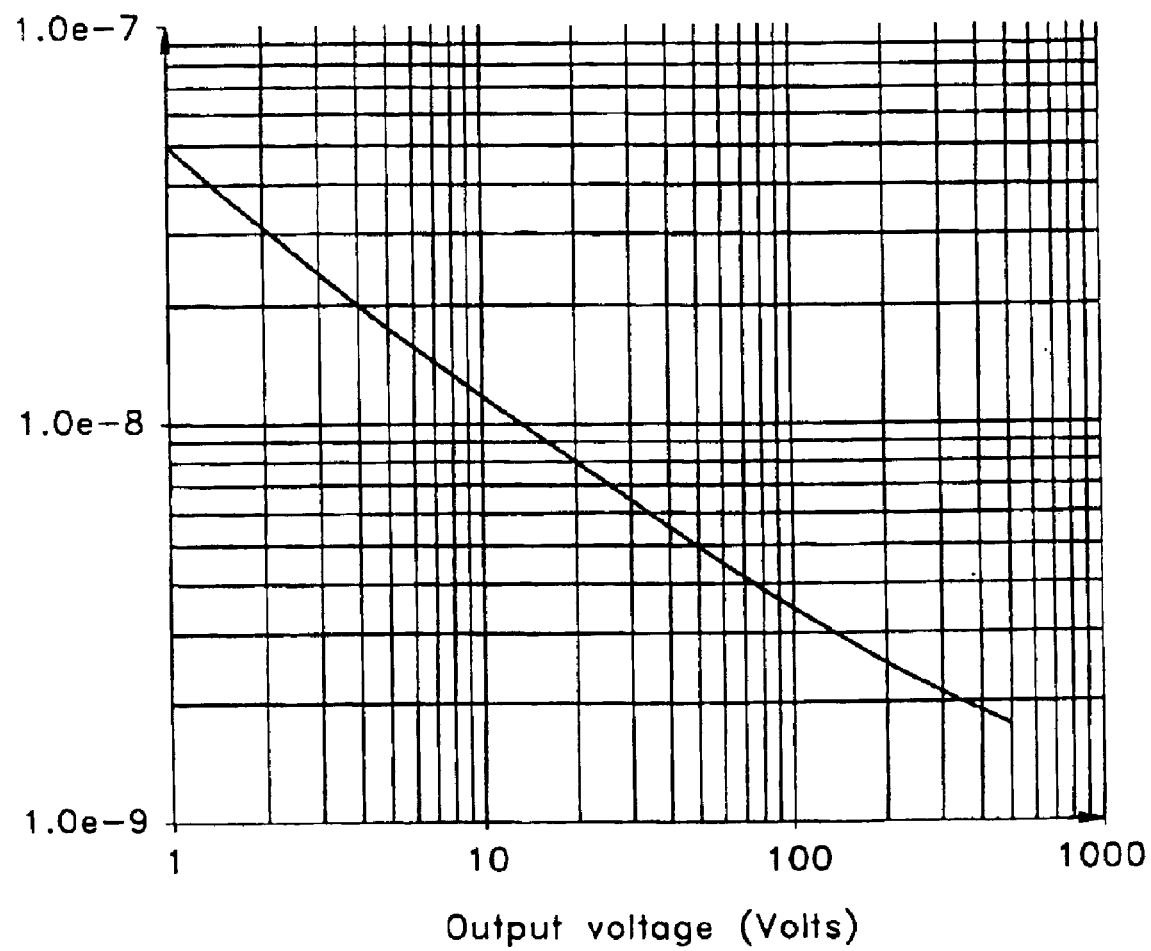
FIG. 10 is a diagram of a measured output capacitance with respect to voltage withstand by output switches, in relation to the module of FIGS. 7 and 8.

Referring now to FIG. 10, there is shown, for the embodiment of FIGS. 7 and 8, the measured output capacitance versus the voltage withstand by the Mosfet chips 70 of one row with respect to the substrate 32. At 400 volts, the capacitance is about $1.9 \times 10^{-9}$ Farad. By calculating the value of the interconnection inductance $L_2$ by means of equation (4), we get:

$$L_2 \leq 8.3 \cdot 10^{-9} \text{ Henry.}$$

Referring back to FIG. 8, the magnetic flux responsible for the induced voltage spike passes in part through the cross section 80 between the substrate 32 and the capacitor 72. The other part of the flux passes through the cross section 82 in the capacitor 72 and depends solely on the current change distribution within the multi layer geometry of the capacitor. At 40 Mhz, the skin depth in the capacitor electrodes has a value comparable to the thickness of one of its electrode plates so that the total current gradient loop flows in the first lower layers of the superimposed conductive electrode plates. Thus, no magnetic flux appears in the upper part of the capacitor, the magnetic flux passing mostly in the cross section 80. At high frequencies, any flux change within the capacitor 30 is cancelled by internal current loop therefore no high frequency flux change can exist within the body of capacitor 30.

The cross section 80 of the prototype that has been confidentially tested is about $5.5 \times 10^{-4}$ m² and the length of the module is about 0.03 meters. A cylindrical current loop with an equivalent cross section has a diameter equal to 0.026 meters. Hence the inductance computed with equation (1) is equal to $16.6 \times 10^{-9}$ Henry. The lower interconnection inductance $L_2$ deduced from the equation (4) can be attributed to the presence of capacitor 30 and to the presence of the large aluminum heat sink to which the module was clamped. For the heat sink, as its conductive surface reacts with the magnetic field distribution produced by current gradient loop during the switching sequence, the flux change in the inductance is reduced. Consequently, an equivalent stray interconnection inductance that is lower than what is expected is obtained.

With the present invention, voltage spike can be decreased by lowering the stray inductance $L_2$. This is achieved by reducing the cross section 80. Unfortunately, some space has to be allowed for inserting the control board 78 and to clear the bounding wires 50, 52. But a further reduction of the voltage spike can be achieved by using a second conductive closed loop that reduces the flux changes in the stray interconnection inductance. This second conductive closed loop will be referred to as a spike killer.

For example, referring now to FIG. 3, if we place two conductive walls (not shown) at both ends of the cylinder, these conductive walls react the same way as conductive heat sinks would react to the flux density change coming out from both ends of the cylinder. These conductive walls would act as conductive loops embracing the flux density coming out at each end. The voltage produced in the loops is in proportion to the flux changing rate:

$$v = \frac{d\phi}{dt}.$$

Reacting to the presence of this voltage, a current builds up and immediately generates a magnetic field change in opposition to the magnetic field source, which results in reducing the flux change within the loops.

Figure 11:
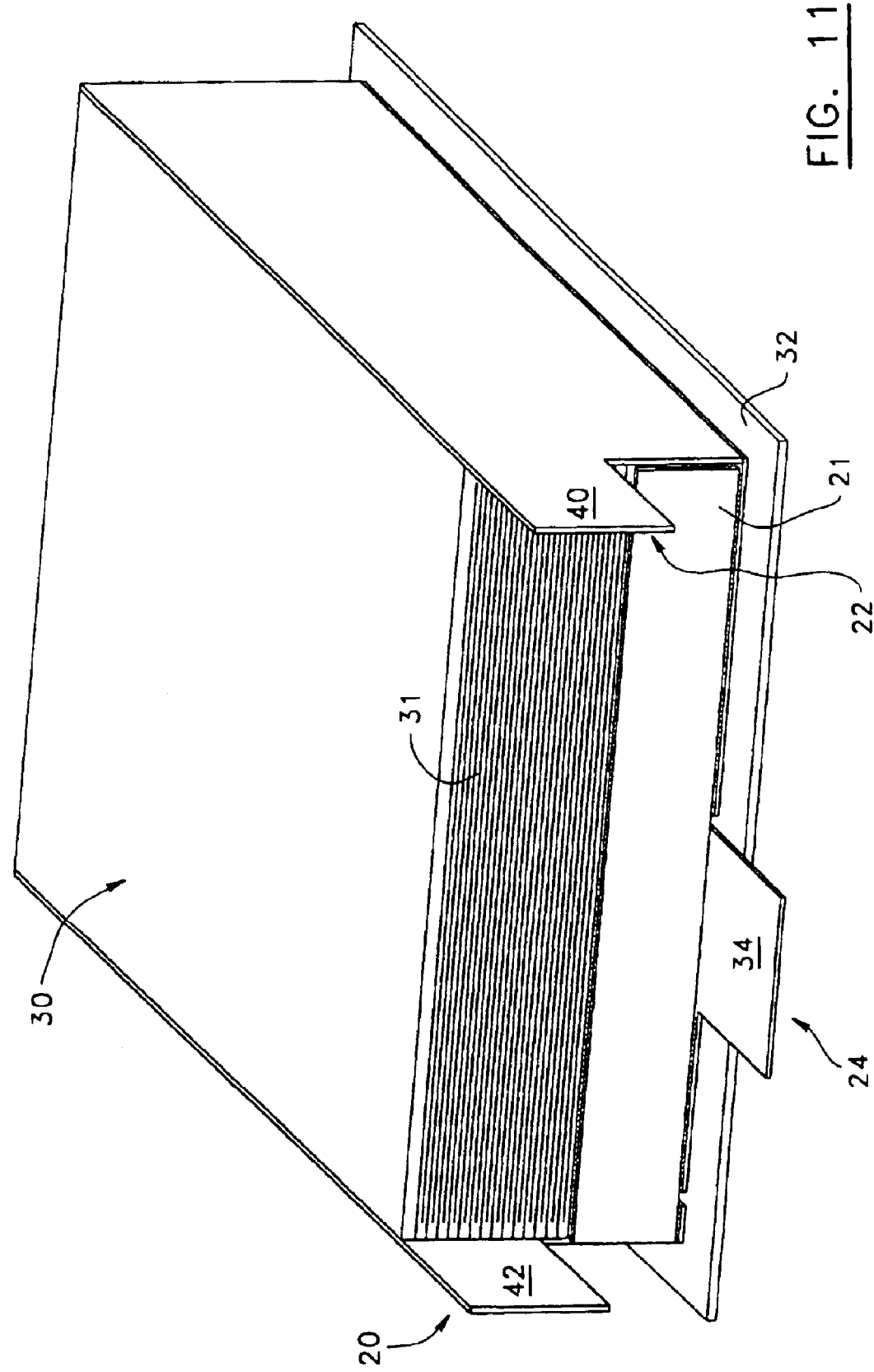
FIG. 11 is a schematic perspective view of a power converting module in accordance with the present invention.

Referring now to FIG. 11, there is shown an embodiment based on the above-mentioned principle. The module has conductive walls 21 placed respectively at both ends of the module. These walls 21 cover at least the cross section 80 of the module shown in FIG. 8. Each of these conductive walls 21 could be connected to one of the three terminals 20, 22 and 24. The cylindrical current path and the walls at both ends are like two coils with a mutual coupling that is not perfectly matched due to their relative position compared to each other so that only a portion of the flux source fluctuation is reduced.

Figure 12:
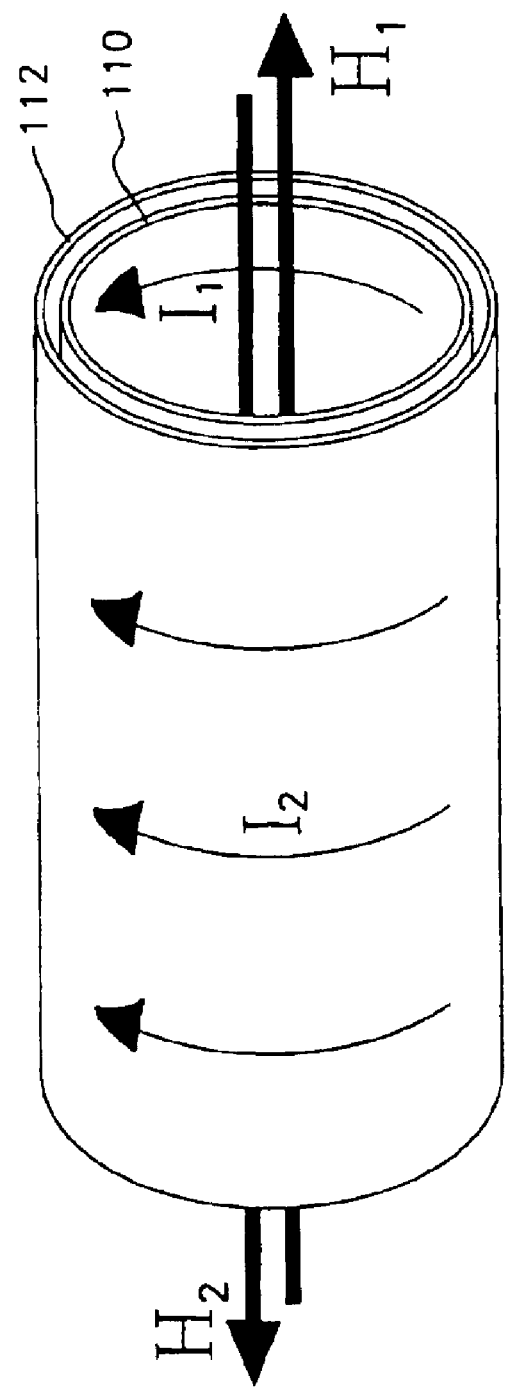
FIG. 12 is a schematic diagram showing the resulting magnetic fields of electrical currents flowing through concentric cylindrical conductors, used in support of explaining the present invention.

Referring now to FIG. 12, there is shown a more effective way to reduce the voltage spike according to the present invention. The magnetic field $H_1$ generated by the cylindrical current loop 110 is surrounded by a second cylindrical conductive loop 112. Preferably, the second loop 112 matches as closely as possible the path followed by the first current loop 110. With this circuit, any magnetic field $H_1$ generated by a current $I_1$ produces a magnetic flux density that is also embraced by the second cylindrical loop 112. Any change of the cylindrical current $I_1$ produces a voltage drop within the cylindrical conductive loop path 112 due to the flux variation. As the second cylindrical loop 112 is a short-circuit, a cylindrical current change $I_2$, in opposite direction, immediately appears in reaction with the presence of the voltage drop, to produce a magnetic field $H_2$ in opposition to the magnetic field source $H_1$. This magnetic field $H_2$ reduces the resulting magnetic flux change. As the current changes $I_1$ and $I_2$ occurs in cylindrical current path that are almost identical in size and location, the majority of the flux change generated by the cylindrical current change $I_1$, is cancelled by the opposite flux change generated by the cylindrical current change $I_2$, thereby, killing the voltage spike associated to the flux source fluctuation.

Figure 13:
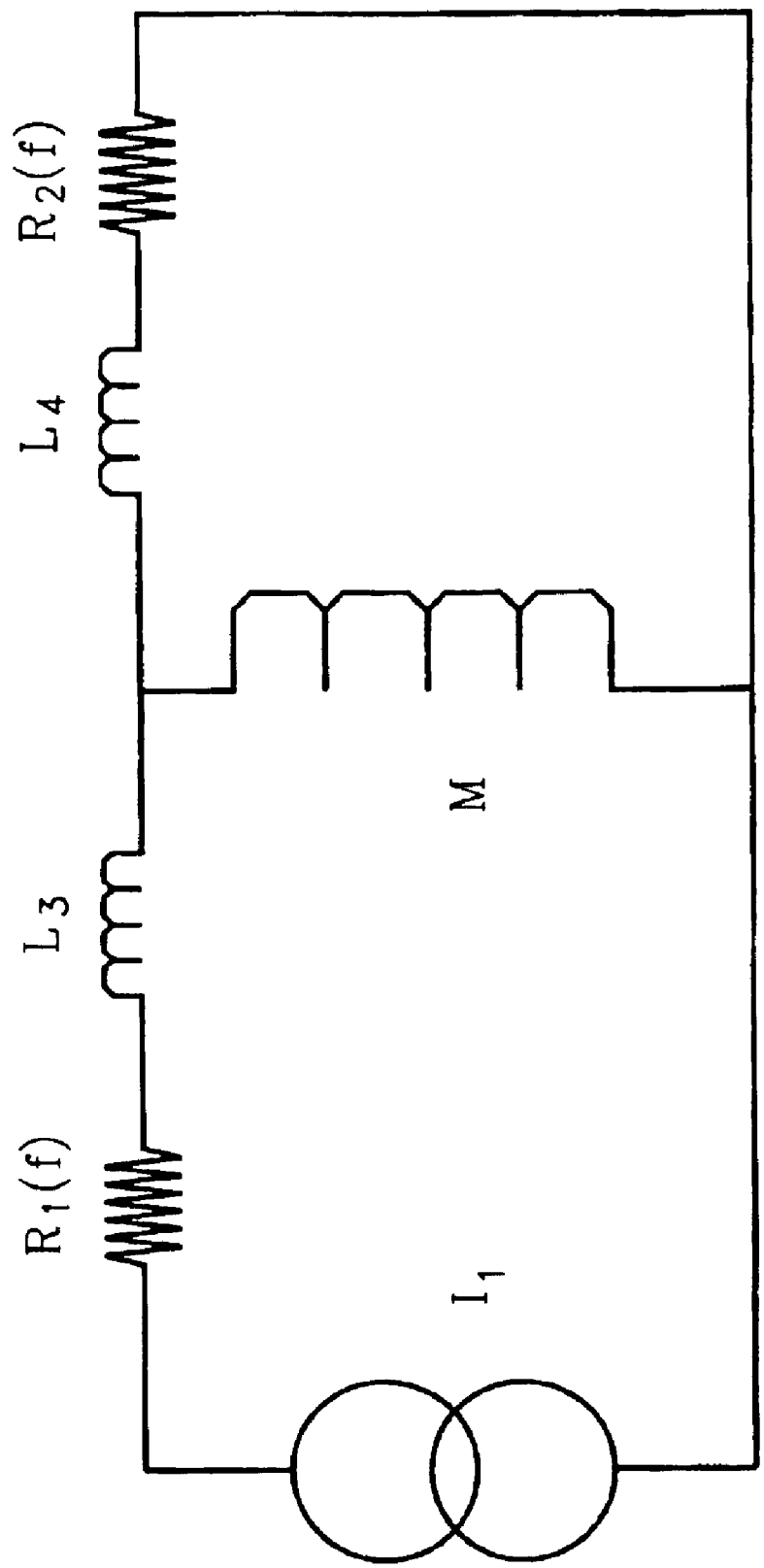
FIG. 13 is a circuit diagram equivalent to what is shown in FIG. 12.

Referring now to FIG. 13, there is shown an electric circuit equivalent to the two concentric cylindrical loops 110, 112 of FIG. 12. The loops 110, 112 are represented by a transformer that has its secondary winding (not shown) shorted. There is a current source $I_1$ connected in series to a circuit composed of a mutual inductance M representative of the flux embraced by the two cylinders 110, 112 plus two very small leakage inductances $L_3$ and $L_4$ associated to the leakage flux, generated by one of the two cylinders 110, 112 and not embraced by the other, due to improper matching. Also there are two resistors $R_1(f)$ and $R_2(f)$ defining the conductors resistance at a rated frequency in relation to the skin effect. The closer the second cylinder 112 shown in FIG. 12 is to the first cylinder 110 shown in FIG. 12, the lower the leakage inductances $L_3$ and $L_4$ are.

Figure 14:
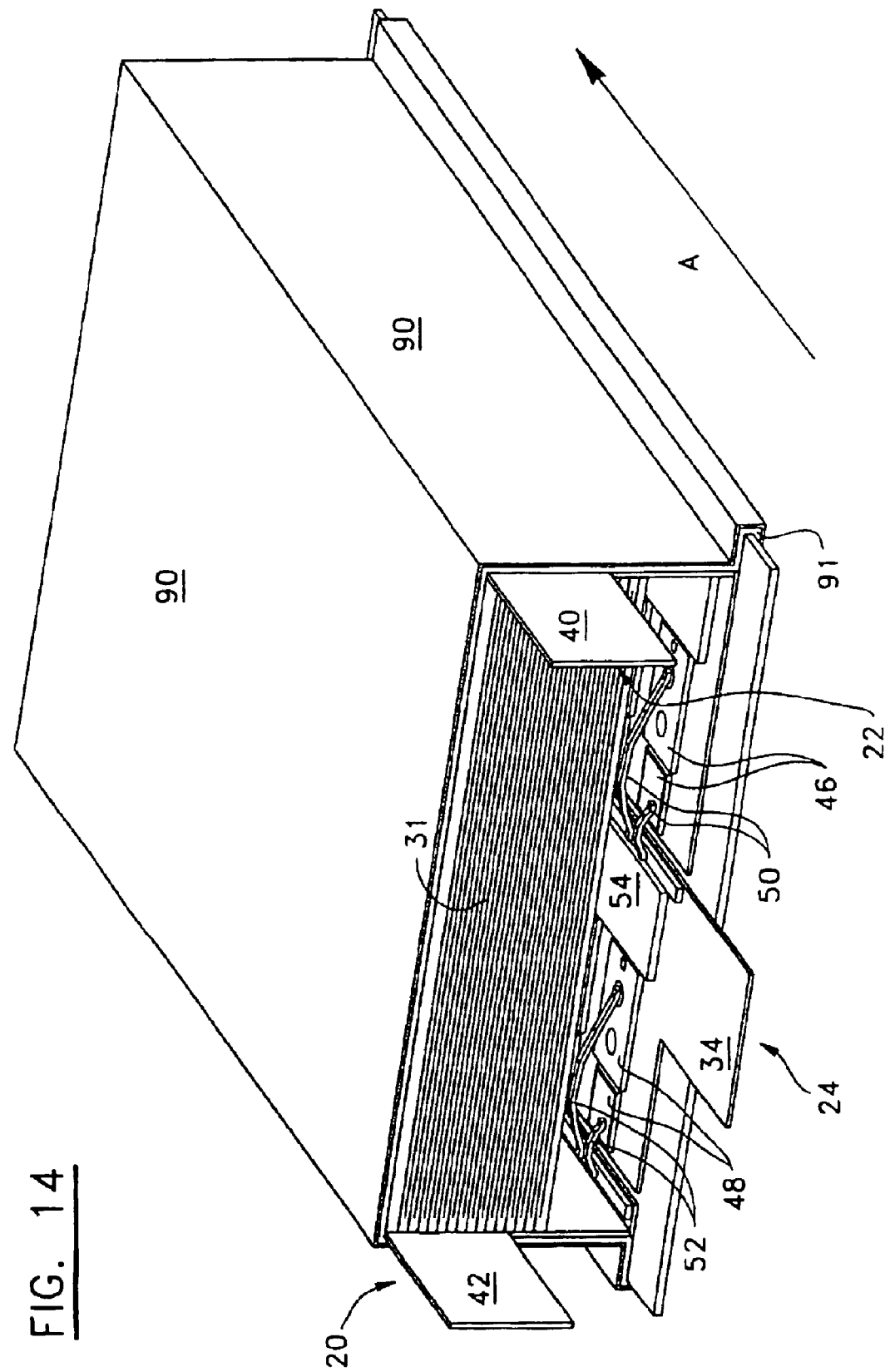
FIG. 14 is a schematic perspective view of a power converting module according to the present invention.

Referring now to FIG. 14, there is shown a perspective view of a module with a second conductive closed loop in accordance with the present invention. The module assembly is similar to the one shown in FIG. 4 except that it further comprises a housing including conductive walls 90 surrounding the reduced cross section belt-like current closed loop 64 shown in FIG. 5, whereby, in operation, an electric current is magnetically induced into the conductive walls 90 to further reduce voltage spikes associated to stray interconnection inductance. The conductive walls 90 surrounds the module assembly along direction A. These conductive walls 90 are insulated from the conductive parts within the module assembly by an insulating material 91. These conductive walls 90 form a closed loop which embraces the magnetic flux density generated by the transient belt-like current of the half bridge power converter during the switching sequence. Thereby, a counter current is induced in the closed loop 90 and reduces any flux change within the cross section thereof. As there is no flux produced in the capacitor, the matching of the two loops is very good and consequently two concentric belt currents in opposite direction are produced. In doing so, the flux change in the stray interconnection inductance of the module is significantly reduced, and therefore voltage spikes are also reduced. According to the preferred embodiment shown in FIG. 14, the method for converting a DC voltage into an AC voltage comprises the additional step of surrounding the reduced cross section belt-like current closed loop by means of a housing including conductive walls.

The spike killer described above acts like a clamping device which maintains constant most of the magnetic field produced in the belt-like current closed loop 64 shown in FIG. 5 during the switching operation. The energy contained in the magnetic field is stored in the mutual stray inductance M that has a value near to the stray inductance $L_2$ shown in FIG. 1.

Figure 15:
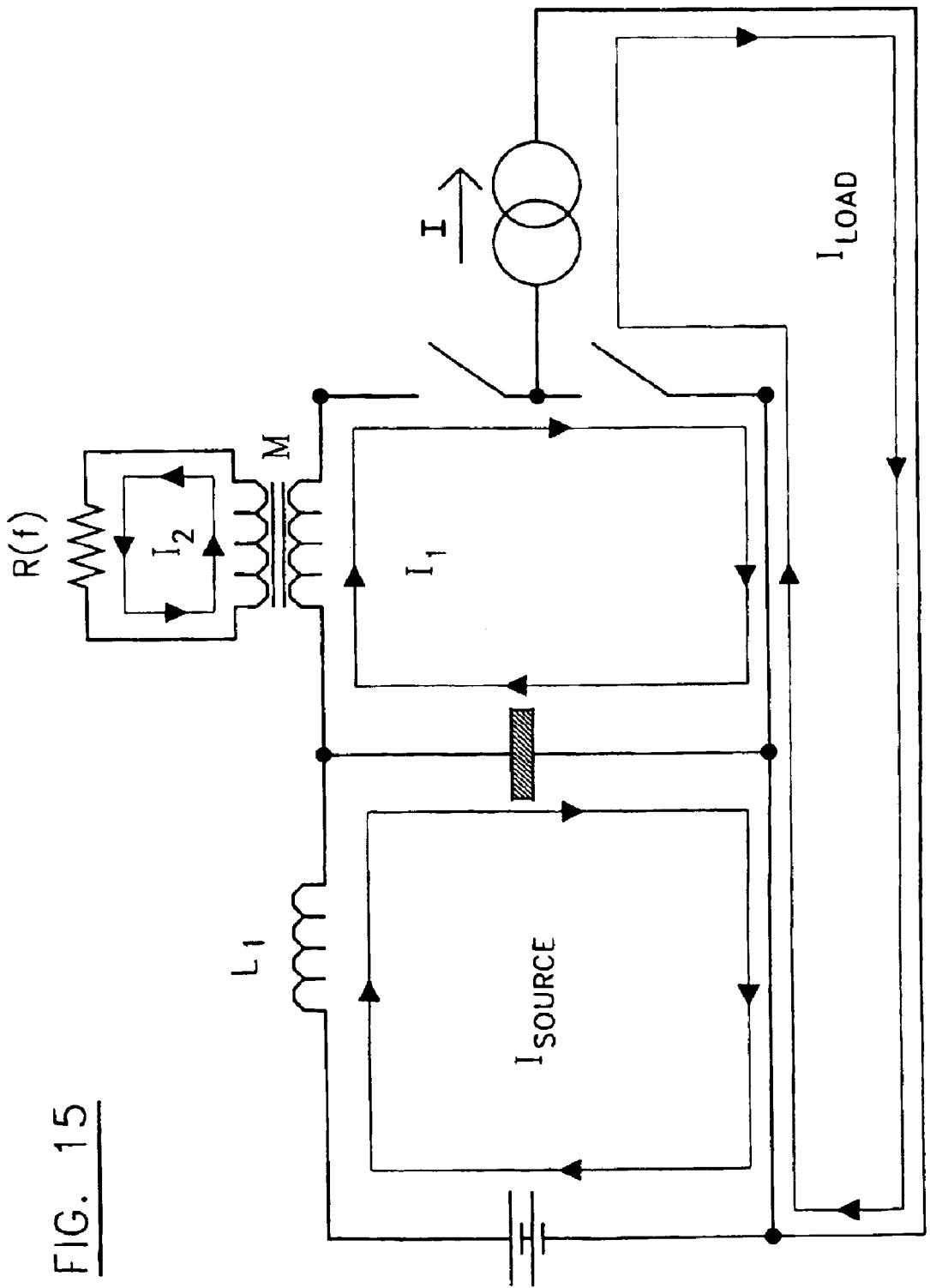
FIG. 15 is a schematic circuit diagram representative of a power converter including the module shown in FIG. 14.

Referring now to FIG. 15, there is shown a circuit diagram representative of a power converter including the module shown in FIG. 14, assuming that there is a sufficient good matching between the two closed loops to neglect leakage inductances $L_3$ and $L_4$ shown in FIG. 13. The current distribution can be represented by four mesh currents $I_1, I_2, I_{Load}$, and $I_{source}$. The mesh currents $I_{Load}$ and $I_{source}$ are continuous and thus do not produce significant current discontinuity. A high flux change is generated by changes in mesh currents $I_1$ and $I_2$. This high flux is dependent upon the geometry of path of currents $I_1$ and $I_2$.

Figure 16:
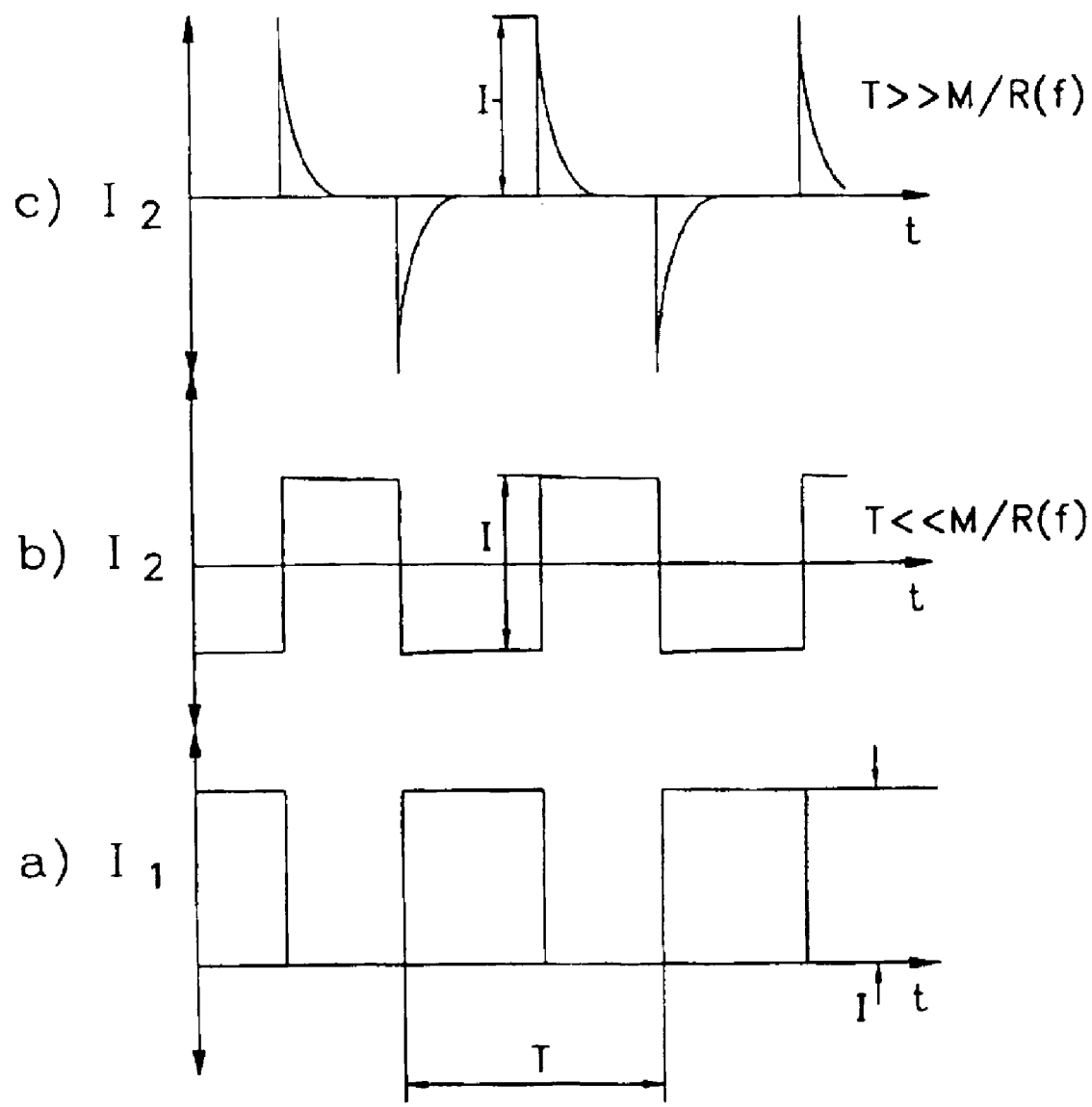
FIGS. 16(a), (b) and (c) are diagrams illustrating mesh currents $I_1$ and $I_2$ of FIG. 15 with respect to time, currents $I_2$ being shown in two different situations.

Referring now to FIGS. 16(a), (b) and (c), there are shown curves illustrating the AC mesh currents $I_1$ and $I_2$ of FIG. 15 with respect to time. Mesh current $I_2$ is shown for two different switching periods T such as T<<M/R(f) and T>>M/R(f). As shown in these FIGS. 16(a), (b) and (c), the spike killer reacts to any flux change by producing a current that suppresses this flux change during the switching phase. On a larger time frame, the life time of the flux produced by the spike killer depends on its time constant M/R(f), the time period between the switching sequences being T.

When the time period T is much larger than M/R(f), the magnetic energy stored by the spike killer vanishes in joule losses within its conductive loop as shown in FIG. 16(c) combined with FIG. 16(a). The total amount of losses in watts equals the product of the amount of magnetic energy loss between each switching event by the switching frequency of the switching events. Thus in this situation, the spike killer acts as a dissipative clamping device.

When the time period T is much smaller than M/R(f), the major portion of the magnetic energy stored in the spike killer is still present at the beginning of the next switching phase as shown in FIGS. 16(a) and (b). Thereby the losses relative to the magnetic energy in Joule in the spike killer do not increase anymore linearly with the switching frequency because the magnetic energy is rather exchange between the mesh currents $I_1$ and $I_2$. Thus in this situation the spike killer acts as an inductance reducer that further lowers the mutual stray inductance M of the power converter module.

Compared to the traditional dissipative clamping devices, the spike killer of the present invention limits its power losses as the switching frequency increases. Also, the spike killer acts directly on the stray interconnection inductance to maintain the presence of the stored magnetic energy during the switching phases. Therefore, no energy is pumped out from the DC supply source because of this inductance as it is in cases where a traditional clamping device is used, and the current falling rate is still under the control of the switch. These are further advantages of the present invention in relation to the prior art.

The spike killer can be carried out according to the present invention by closing both ends of the first or second belt-like current closed loop with conductive walls. However, this has no meaningful spike killing effect. A more efficient spike killing effect is achieved by having two concentric belt-like current closed loops that are as close as possible with each other without being in contact to minimize the leakage flux generated by the first belt like current loop and not embraced by the second belt like conductive loop. Thereby the use of a thin insulating material 91, as shown in FIG. 14, gives good results. Both open ends can serve as passage for the electrical and logical cable links. Also, the conductive walls of the spike killer could be part of the module housing which can serve as a heat exchanger. With the use of a spike killer according to the present invention, flux fluctuations within the mutual inductance M are reduced to minimum to further reduce the voltage spikes, allow a much higher switching speed, avoid the use of clamping devices or snubbers, allow a control of the current falling rate by the semiconductor switches, allow several switching devices to be mounted in parallel, limit losses related to the mutual stray interconnection inductance for high switching frequency, and reduce the size of the converter.

Referring again to FIG. 14, for the above reasons, the power converting module is therefore provided with a spike killer, according to the present invention. The housing includes the conductive walls 90 surrounding the reduced cross section belt-like current closed loop, whereby, in operation, an electric current is magnetically induced into the conductive walls 90 to reduce the flux change within the mutual stray interconnection inductance. Accordingly, the method of converting a DC voltage into an AC voltage comprises in this case the additional step of surrounding the reduced cross section belt-like current closed loop by means of a housing including conductive walls 90.

The module assembly shown in FIG. 14 is similar to the one shown in FIG. 4 but it further comprises the conductive walls 90 extending along direction A. These conductive walls 90 are insulated from the conductive parts within the module assembly by the insulating material 91. These conductive walls 90 form a closed loop which embraces the magnetic field generated by the transient belt-like current of the half bridge power converter during the switching sequence. Hence, the conductive walls 90 reacts and induces an opposite magnetic field which reduces the amplitude of the magnetic flux change generated in the module, thereby reducing the voltage spike generated by the mutual stray interconnection inductance M. With this assembly, a resulting mutual stray interconnection inductance M that is lower than the one of prior art, or equal to the one of embodiment of FIGS. 4, 5 and 6 is obtained. This lower mutual stray interconnection inductance reduces the voltage spike, allows a much higher switching speed, avoids the use of clamping devices or snubbers, allows a control of the current falling rate by the semiconductor switches, allows several switching devices to be mounted in parallel, limits losses related to the mutual stray interconnection inductance for high switching frequency, and reduces the size of the converter.

Figure 17:
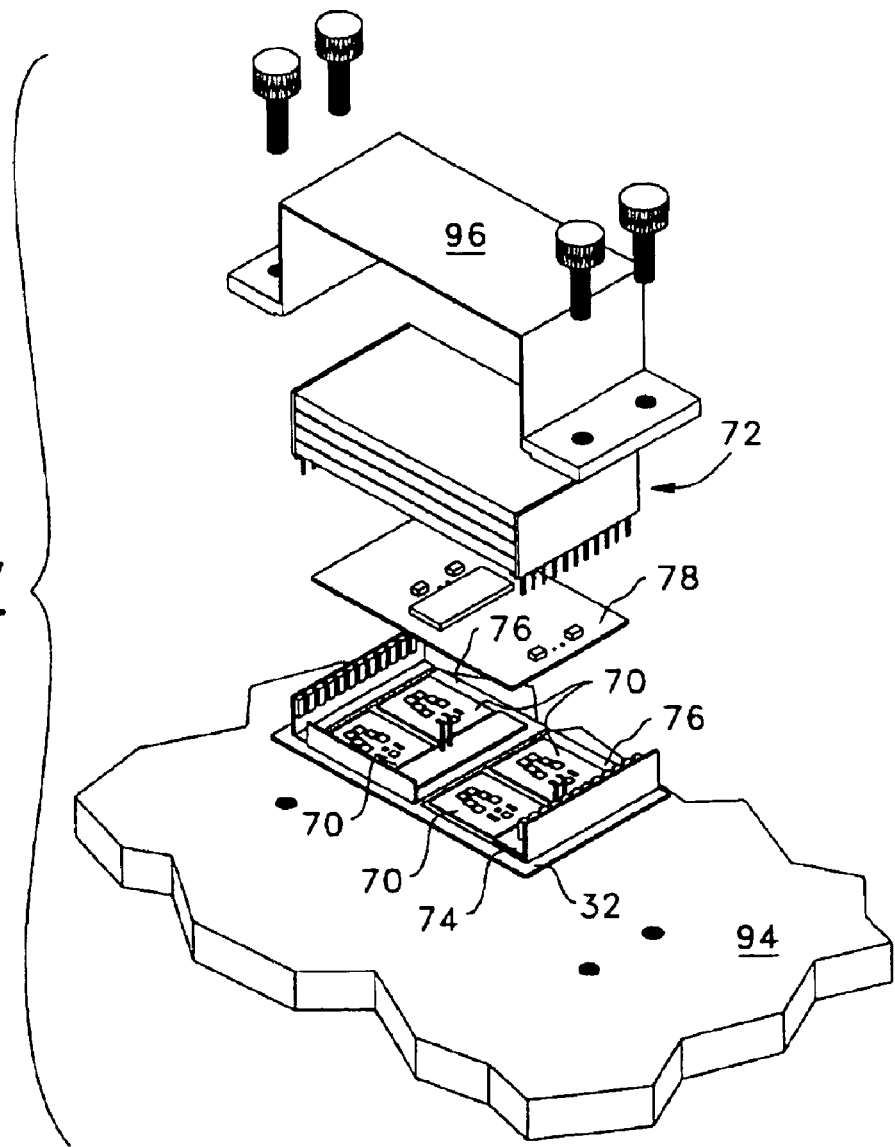
FIG. 17 is a schematic perspective exploded view of a power converting module according to the present invention.
Figure 18:
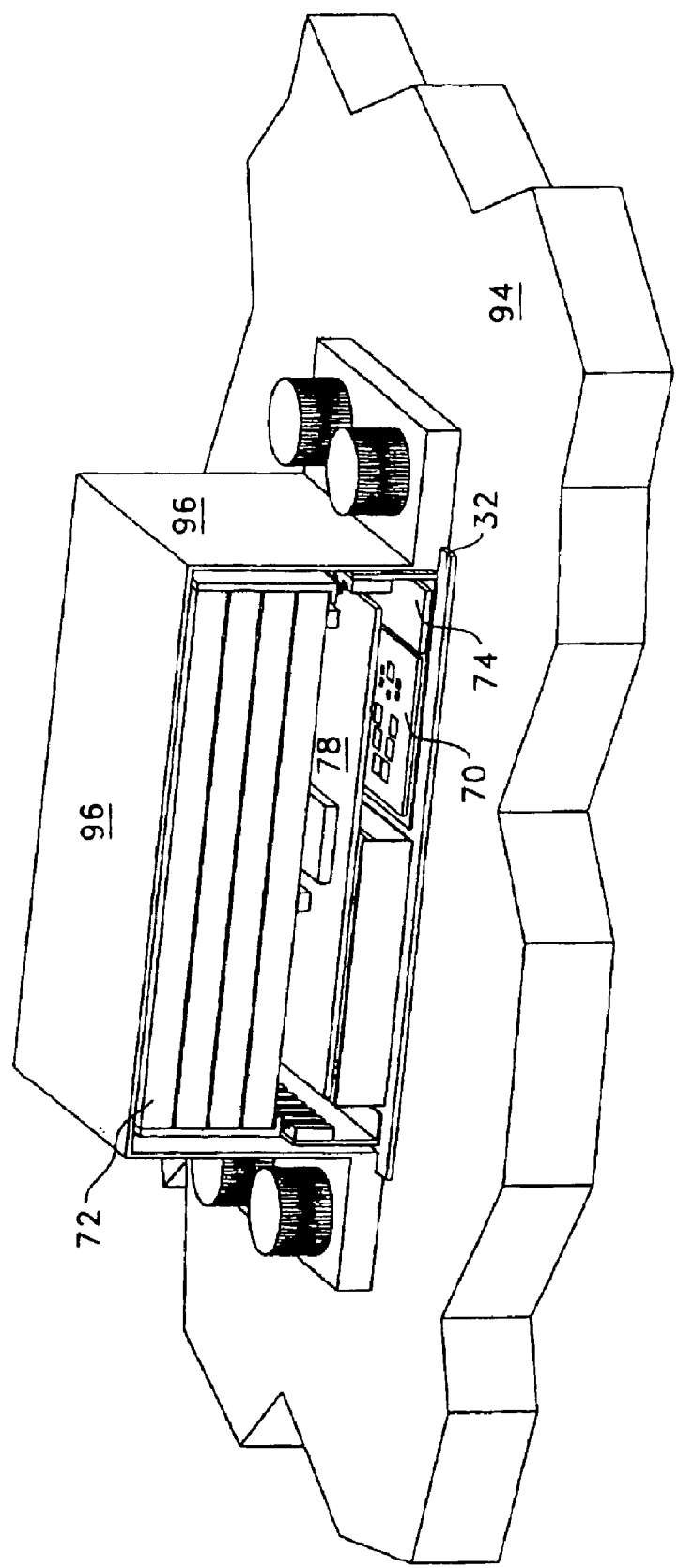
FIG. 18 is a schematic perspective side view of the power converting module shown in FIG. 17 in an assembled position.

Referring now to FIGS. 17 and 18, there are shown in detail the same converting module as shown in FIG. 7 and 8 with a spike killer built in accordance with the present invention. FIG. 17 is a disassembled view of the module with the spike killer, and FIG. 18 is an assembled view of the same module. The module base 32 is mounted on a copper plate 94 and a cover 96 is bolted on the copper plate 94. This cover 96 and the copper plate 94 form a second belt-like conductive path around the first belt-like conductive path in a concentric fashion as shown in FIG. 12. The conductive walls of the housing are then made of at least two parts connected together, which are the cover 96 and the copper plate 94. Connectors (not shown) for receiving voltage from the bus DC voltage source and for supplying the modulated phase are located in the open ends of the module. Small openings can be performed on the conductive walls of the belt-like conductive paths for electrical connections with terminals within the module without affecting noticeably the reducing effect on the flux change in the mutual stray interconnection inductance.

Figure 19:
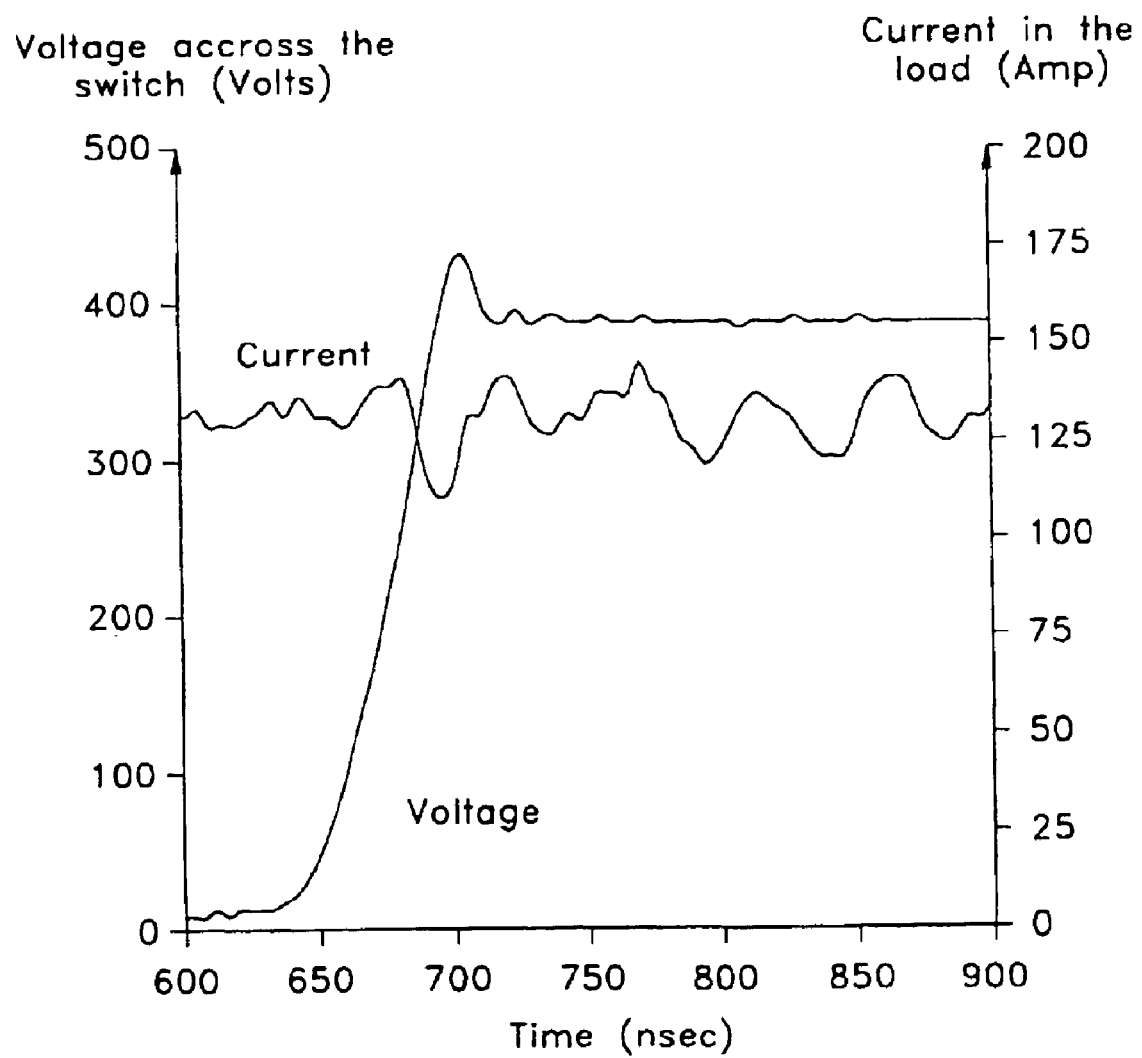
FIG. 19 is a diagram showing, in relation to the module of FIGS. 17 and 18, the voltage across a switch and the current in a load, with respect to time.

Referring now to FIG. 19, there is shown the voltage measured directly across one row of the Mosfet chips 70 of the embodiment shown in FIGS. 17 and 18 during a turn-off sequence of the current flowing through the Mosfet chips 70 we can compare FIG. 9 with FIG. 19 and see that in FIG. 19 the cutoff current is also 125 amperes and is coming from the same inductive load with the bus voltage also at 400 volts. The voltage oscillation seen in FIG. 9 is practically gone and the voltage spike is reduced, therefore showing the advantage of the addition of the second belt-like conductive path.

Figure 20:
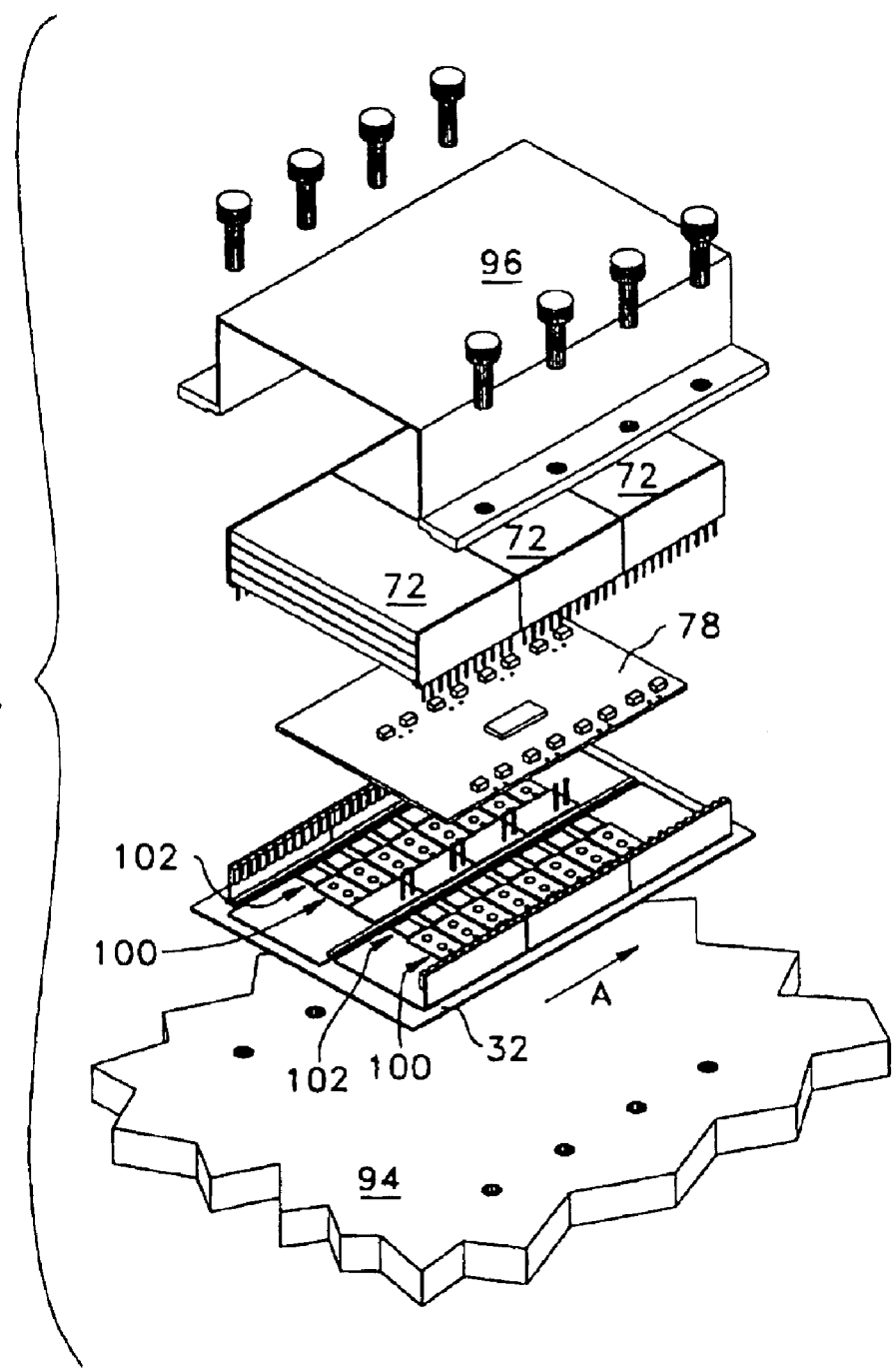
FIG. 20 is a schematic perspective exploded view of a power converting module according to the present invention.
Figure 21:
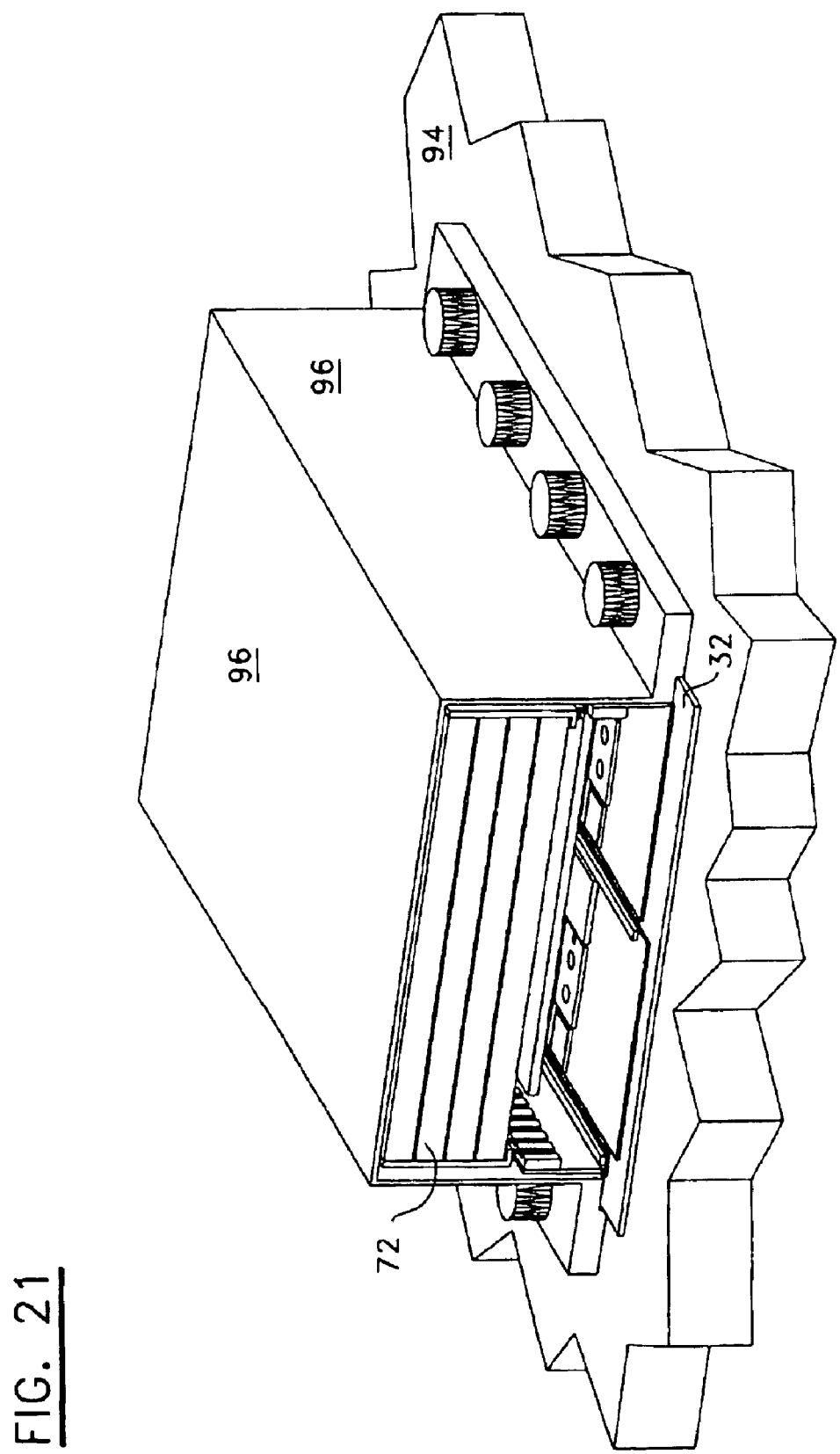
FIG. 21 is a schematic perspective side view of the power converting module shown in FIG. 20 in an assembled position.

Referring now to FIGS. 20 and 21, there are shown a larger module that is built with IGBT chips 100 and diode chips 102. In these figures, the bounding wires and the details of the circuit boards are omitted to not overload them. FIG. 20 is a disassembled view of the module, and FIG. 21 is an assembled view of the same module. The assembly has a length that is three times longer along the direction A than the length of the embodiment shown in FIGS. 17 and 18. The insulating gap between the second belt-like conductive path and the first belt-like conductive path, and the gap between the base plate and the decoupling means are reduced with respect to the embodiment shown in FIGS. 17 and 18. Eight IGBT chips with eight diode chips are connected in parallel for each row of the module. With this assembly, the mutual stray interconnection inductance is smaller due to the larger 1/d ratio of the module as shown in equation (1), 1 and d of the module being defined as shown in FIG. 3.

Figure 22:
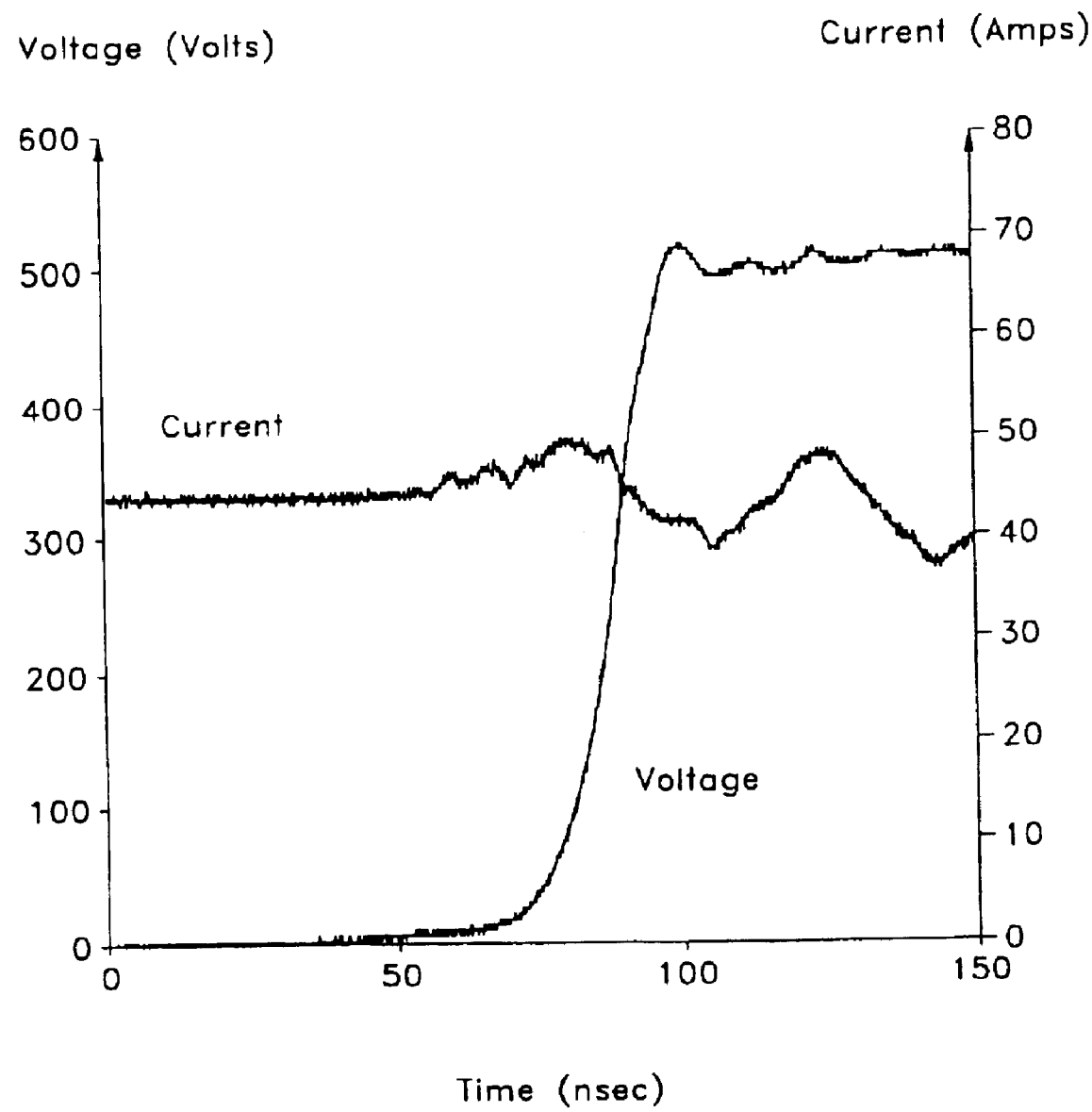
FIG. 22 is a diagram showing, in relation to the module of FIGS. 20 and 21, the voltage across a switch and the current in a load, with respect to time.

Referring now to FIG. 22, there is shown the result of switching tests performed on the module shown in FIGS. 20 and 21. The voltage is measured across one row of IGBT chips 100 during a switching test. The cutoff current is 45 amps and the bus voltage is set at 500 volts. The test shows a turn off sequence with no apparent voltage spike and the voltage swings from 0 to 500 volts in less than 20 nsec. The improvement is due to the larger 1/d ratio, the smaller insulating gap between the two belt-like conductive paths, and the smaller gap between the base plate and the decoupling means which further reduce the voltage spike generated in the stray interconnection inductance as compared to the embodiment of FIGS. 17 and 18, thereby illustrating the efficiency of the present invention.

The spike killer of the present invention can be made according to different embodiments. The modules shown in FIGS. 17, 18, 20 and 21 illustrate a belt-like conductive loop having two parts. The first part is the cover 96 which is made of conductive material, such as copper or aluminum. This cover 96 has two sides welded or clamped with securing elements, such as bolts, to the conductive base plate 94 placed underneath the module insulating base 32. The plate 94 constitutes the second part of the loop. The base plate 94 can form a heat exchanger or can be bounded underneath of the insulating plate 32, such as a copper bound layout bounded underneath a copper-ceramic-copper board. Also, to insure proper insulation, the spike killer is separated from the module with insulating material, (not shown).

According to the present invention, a spike killer can be also made by using a thin film metal deposition. The conductive walls 90 of the housing shown in FIG. 14 are then formed by a metal deposition over insulating walls 91. In such a case, the module is first encapsulated in a plastic or any other material with insulating properties and is then sprayed with a metallic vapor or dipped in a liquid metal bath to form a thin film metal deposit on its surface. This metal deposit forms the belt-like conductive loop of the spike killer. The thin film deposit may be only applied on specified portions of the module such as for example, the top and the sides thereof, the remaining part of the belt-like conductive loop being a copper layout bounded underneath the surface of the insulating base 32.

Figure 23:
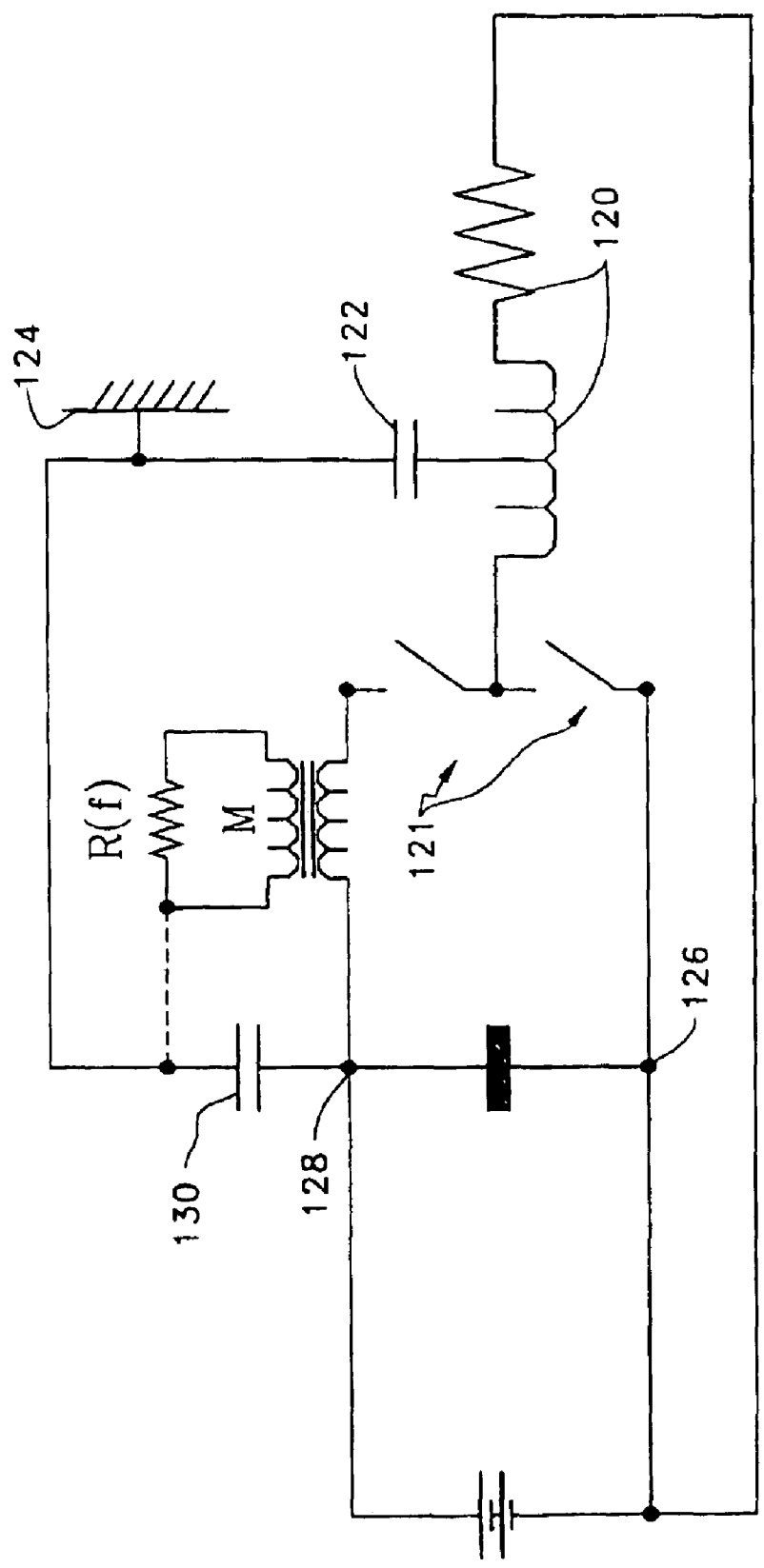
FIG. 23 is a schematic circuit diagram representing a power converter including the module shown in FIG. 14, used in support of explaining the present invention.

Referring now to FIG. 23, there is a schematic circuit diagram representing a power converter including the module shown in FIG. 14. A problem often occurs because of the stray capacitance present between the load and an adjacent conductive part such as, for example, the stray capacitance present between the stator coils of a motor and its metal hollow portion. This problem is schematized in the diagram of FIG. 23. A half bridge power converter 121 supplies AC voltage to a load 120 having a stray capacitance 122 with a conductive part 124. Through this stray capacitance 122, the potential of the conductive part 124, by reference to the electrodes 126 and 128 of the DC bus voltage, oscillates at a frequency in accordance with the square wave voltage applied to the load 120 by the half bridge power converter 121. Any form of stray impedance connected between the load housing and one of the electrodes 126, 128 of the DC supply voltage bus produces a current through the stray capacitance 122. This current is a source of noise problems and may be harmful.

In a case where none of the electrodes 126, 128 of the voltage bus is directly grounded to the conductive part 124, a bypass capacitor 130 with a higher value than the one of the stray capacitor 122 is connected between the conductive part 124 and at least one of the bus voltage electrodes, for instance the electrode 128. The induced stray current within the stray capacitance 122 follows an easy path through the capacitor 130 back to the bus electrode 128. With this circuit, the amplitude of the voltage that builds up on the bypass capacitor 130 is a fraction of the supply voltage, the value of this fraction being determined by the ratio of the stray capacitor value with respect to the bypass capacitor value. In the case of the module without the spike killer shown in FIGS. 4, 5, 6 and 11, this bypass capacitor can have one end connected to one of the electrode terminals 20 or 22 of the module. The free end of the capacitor is available for connection with a conductive part producing a stray capacitance with the load (not shown).

Figure 24:
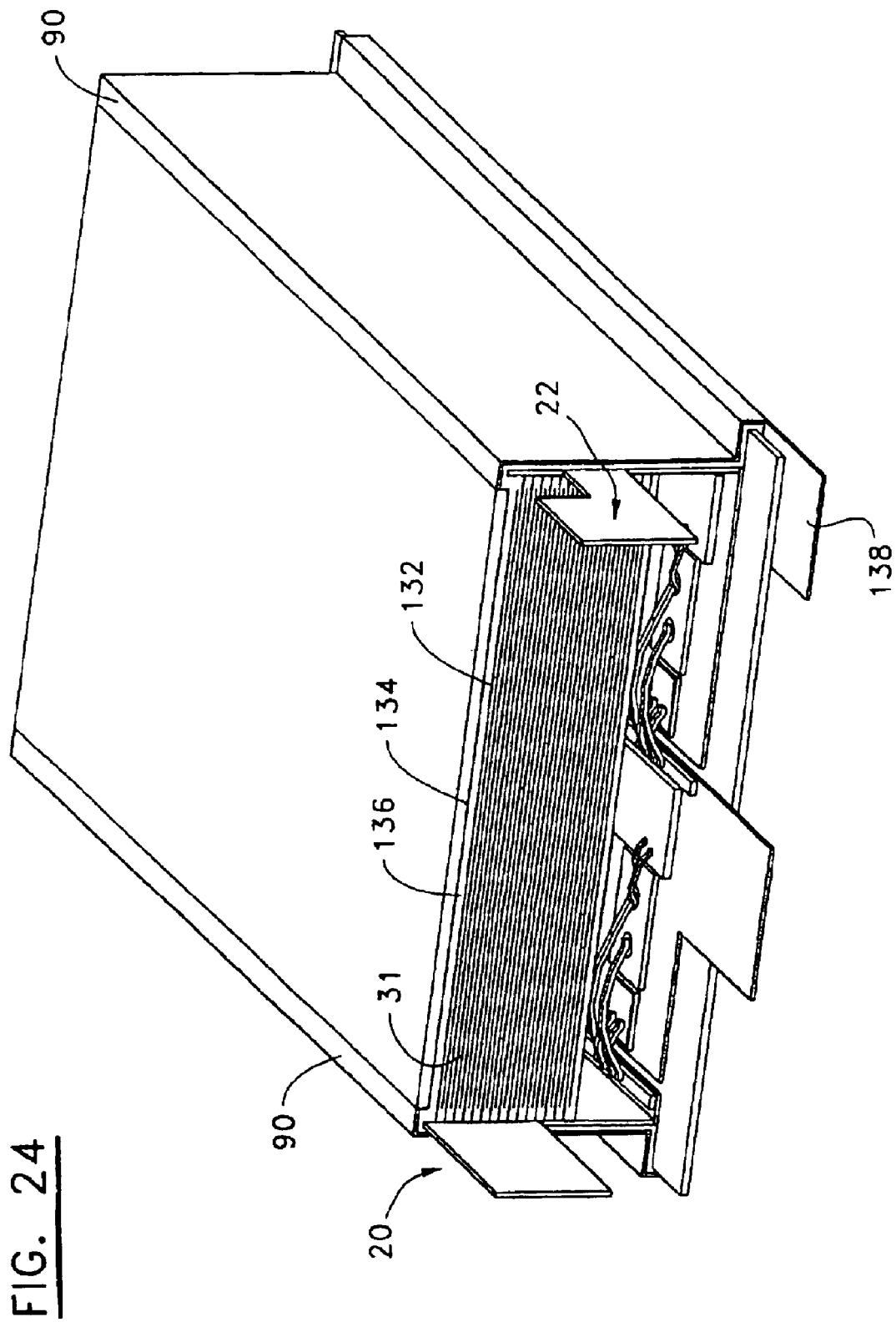
FIG. 24 is a schematic perspective view of a power converting module according to the present invention.

Referring now to FIG. 24, there is shown an embodiment similar with the one shown in FIG. 14, but it further includes a built-in bypass capacitor. In the case of this module provided with a spike killer according to the present invention, the free end of the capacitor is connected to the walls 90 of the belt-like conductive loop of the spike killer, and a free connection point 138 of the spike killer is available on the conductive loop for connection to a conductive part (not shown) that forms a stray capacitance with the load. If this capacitor is a discrete part, it can be inserted in a space located between the conductive walls 90 of the spike killer and the module.

In the case of the module shown in FIG. 24, a horizontal conductive plate 134 is superimposed over the top last conductive plate 132 of the superimposed electrode plates 31, and separated therefrom by a dielectric material 136, such as ceramic, the whole thereby forming said built-in bypass capacitor. The conductive plate 134 constitutes one segment of the belt-like conductive walls 90 of the spike killer. In FIG. 24, for purpose of clarity, the gap shown in this figure between the plate 134 and the last plate 132 is larger than the existing gap which is actually the same as the one between adjacent plates of the superimposed electrode plates 31. Also, the connection point 138 can be located anywhere on the conductive walls 90 of the spike killer for connection with the conductive part 124. The capacitor is connected between the conductive plate 134 which is part of the conductive walls 90 of the housing, and the conductive plate 132 which is electrically connected to one of the DC terminals. The conductive walls provide one connecting point 138 for electrical connection purpose. The capacitor is then formed by a wall of the conductive walls that is adjacent to the top electrode plate 132 and that is separated from the top electrode plate 132 by means of dielectric material 136. Thereby, when the belt-like conductive walls of the spike killer are connected to a conductive part (not shown) forming a stray capacitor with the load, a bypass capacitor made according to the present invention is provided.

According to another aspect of the present invention, the fact that the module has a very low stray interconnection inductance which is further clamped by the spike killer, does not produce a Miller effect (reference: International Rectifier, Hexfet, Power MOSFET designer's Manual, application note #947) during the switching phase. This Miller effect is present in gate capacitance transistors such as Mosfets and IGBTS. In the case of a Mosfet, the drain current is controlled by the amount of charges cumulated in its gate to source capacitance. During the turn-on phase, the drain voltage falls because the increasing drain current induces a voltage across the interconnection inductance. As the drain voltage falls, a portion of the gate input charging current is bypassed through the gate to drain stray capacitance, depriving the gate to source capacitance of the charges it would have normally received. This negative feedback slows the rising drain current and is called the Miller effect.

In the case of the module made according to the present invention, the voltage drop at the interconnection inductance is negligible so that the Miller effect is not present. Without the Miller effect, the input gate current is not bypassed and serves only to charge the gate to source capacitance of the Mosfet or IGBT. Therefore, the drain current rising rate depends only on the input gate charging current. When the input gate current is too large, the rising time of the drain or collector current is very short. This can result in a problem if the switch that is turned on takes over the current of an inductive load that flows, in a free wheel mode, through a diode having a reverse recovery charge. A high current rising rate increases the reverse recovery current density within the diode and the Mosfet or IGBT, which can be destructive for the semiconductors. To insure a safe operation, the gate input charging current is limited with a resistor to limit the rising current rate. After recovery of the diode, the drain voltage falling rate is dependent on the same input gate current now discharging the gate to drain capacitance. This drain voltage falling rate is less problematic and can be accelerated to minimize switching losses. This is carried out by injecting a higher gate input current to improve the switching performance.

Figure 25:
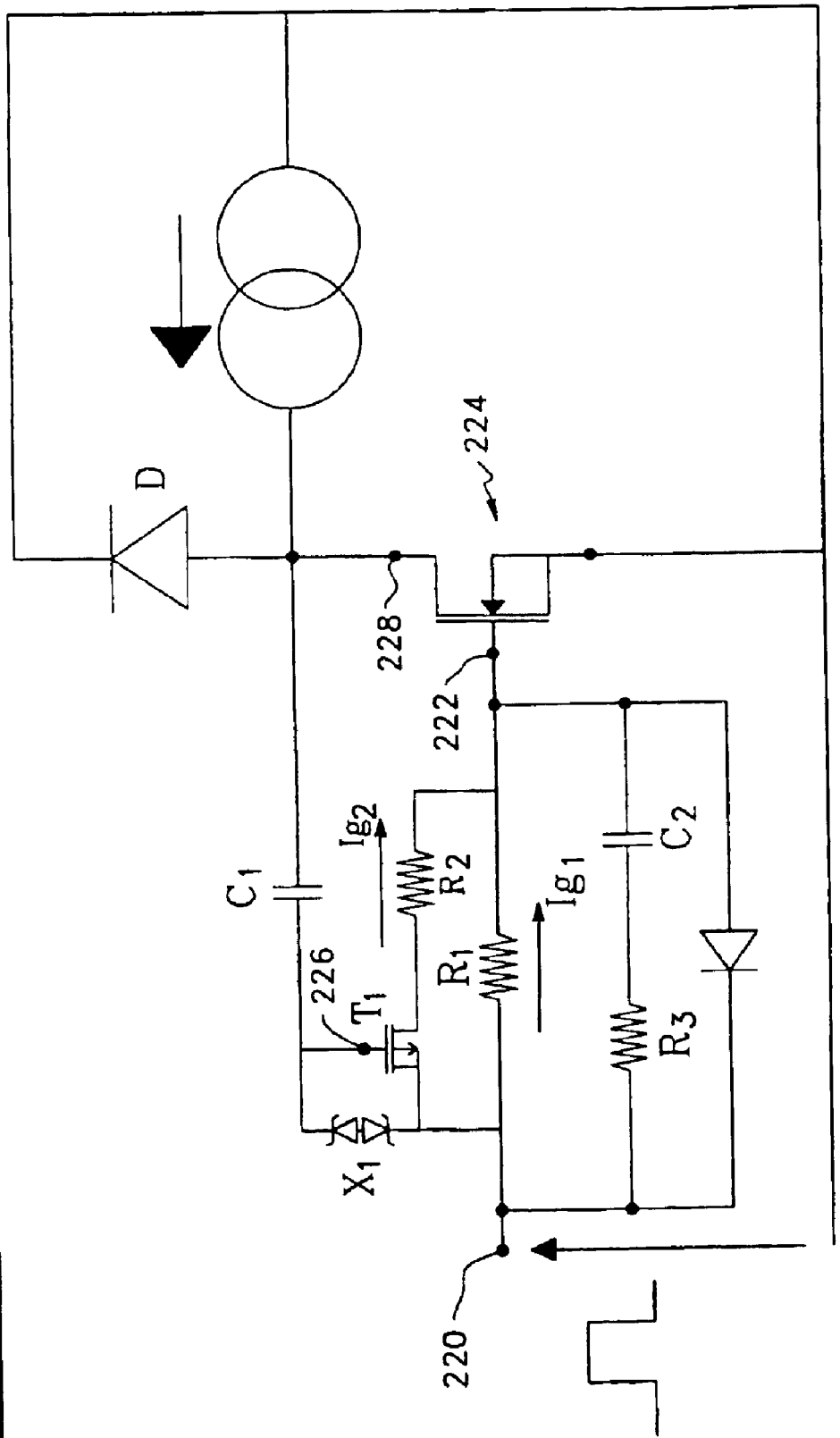
FIG. 25 is a schematic circuit diagram of the switch a power converting module with its driver.

Referring now to FIG. 25, there is shown a circuit diagram of a switch with its driver. To improve the overall switching performance of the switch, during the turn-on phase, the gate input current is limited to two values, one for the rising current and one for the falling voltage. This function is performed by means of the driver. The driver includes a terminal 220 to receive a gate signal for the corresponding semiconductor device. A first resistor $R_1$ is connected between the terminal 220 and the gate 222 of the corresponding semiconductor device 224.

There is a circuit segment including a voltage gate controlled switch $T_1$ and a second resistor $R_2$ connected in series. The circuit is connected in parallel to the first resistor $R_1$. A capacitor $C_1$ is connected between the gate 226 of the voltage gate controlled switch $T_1$ and the collector 228 of the corresponding semiconductor device 224 for monitoring collector voltage signal thereof. There is a voltage clamping device $X_1$ connected between the gate 226 of the voltage gate controlled switch $T_1$ and the terminal 220. Whereby, in operation, the first resistor $R_1$ limits gate current of the corresponding semiconductor device prior to a drop of the collector voltage signal thereby limiting rise time of the collector current, and the first and second resistors $R_1$ and $R_2$ limit the gate current of the corresponding semiconductor device 224 during the drop of the collector voltage thereby limiting dropping time of collector voltage.

A first resistor $R_1$ is connected between the input that receives the square voltage signal and the gate 222 of the switch 224 to limit the gate input charging current to a first value $Ig_1$, until the current flowing through the diode D evacuates its reverse recovery charges and enters its blocking state. Then, the drain voltage starts to fall and is detected by a capacitor $C_1$ connected between the drain 228 of the switch 224 and the gate 226 of a P channel Mosfet $T_1$ that is connected in series with a second resistor $R_2$. When the switch 224 is a Mosfet, the capacitor $C_1$ is connected to the drain 228, and when the switch 224 is an IGBT, the capacitor is connected to the collector. In the text when we refer to the collector, depending on the situation it could also means the drain. The Mosfet $T_1$ and resistor $R_2$ are both in parallel to resistor $R_1$. The dropping voltage induces a current through the capacitor $C_1$ which charges rapidly the gate of the P channel Mosfet $T_1$ which immediately conducts to establish a series connection with the resistor $R_2$. Thus, the input current is increased by a second gate input charging current $Ig_2$, further accentuating the voltage dropping rate to increase the switching speed, thereby reducing the switching losses. A clamping means $X_1$ is connected across the gate capacitance of the P channel Mosfet $T_1$ to limit the voltage. A capacitor $C_2$ connected in series with a resistor $R_3$ is added in parallel with the resistor $R_1$, to inject a current pulse in the gate 222 to shorten the delay between the input voltage transition and the start of the drain current rise-up.

Figure 26:
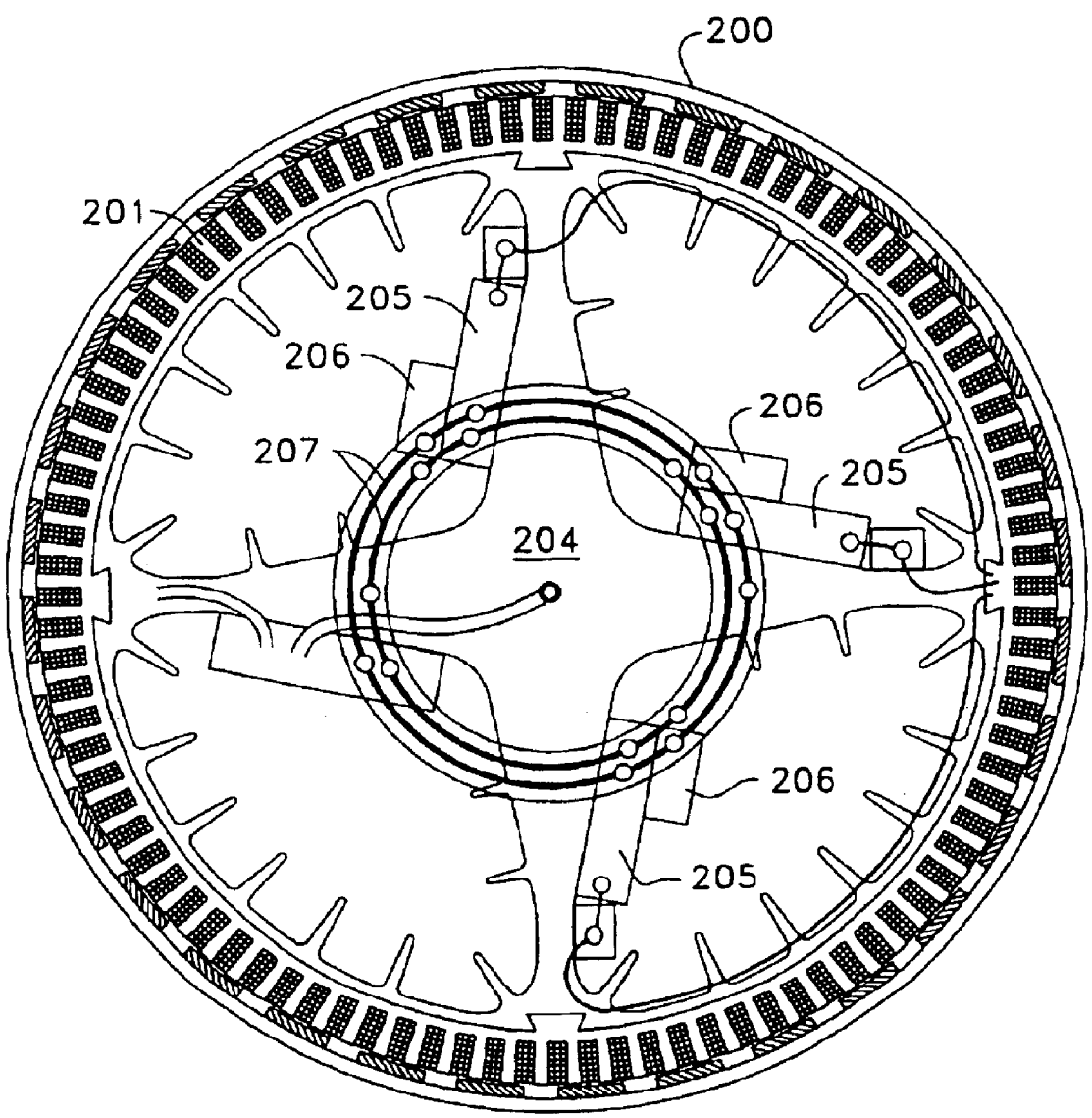
FIG. 26 is a front view partially in cross section of the rotor and stator of a motorized wheel assembly.

Referring now to FIG. 26, there is shown one of the possible applications of the present invention. This application is for motor wheels such as the one disclosed in the U.S. Pat. No. 5,438,228. The electric motor is mounted in a wheel, the power converter of the motor being mounted in a hollow portion of the wheel. The motor has an outer rotor 200 and an inner stator 201 supported on an axle by a cross member 204. The power converter includes modules 205 and capacitors 206, all mounted on the legs of the supporting cross member 204. Conductors 207 are provided to connect each module to a DC voltage bus provided in the hollow portion, and to connect each module to the windings of the stator. The modules constitute a polyphase DC to AC power converter. The compactness of the modules of the present invention makes them convenient for installation within the hollow portion of the motor wheel.

Figure 27:
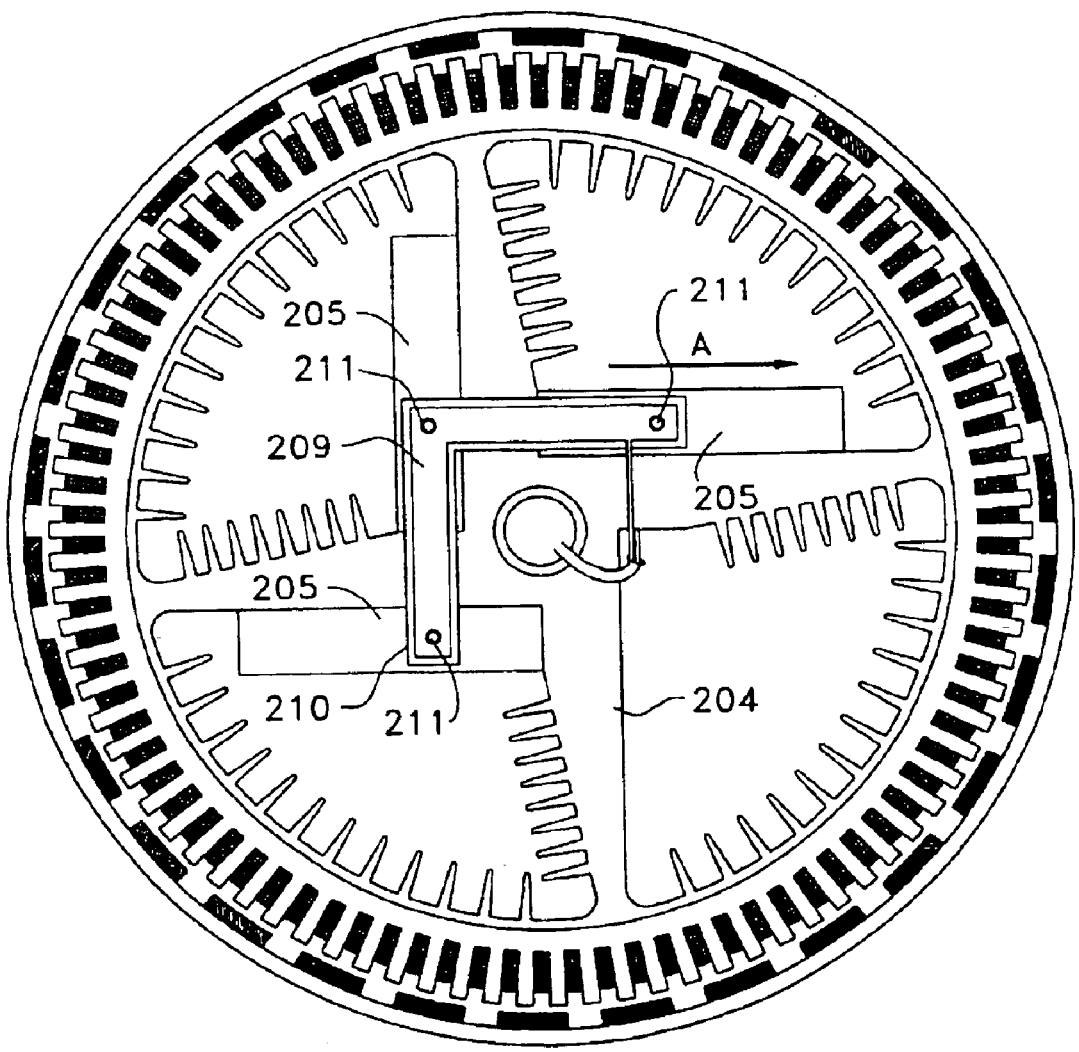
FIG. 27 is a schematic view of what is shown in FIG. 26, with improvements according to the present invention.

Referring now to FIG. 27, there is shown how the power converter of the present invention is mounted on the cross member 204 of the motor wheel. There is the combination of three power converting modules 205 in a motor wheel provided with a stator frame supported by a cross member 204 made of conductive material. The three modules 205 are mounted respectively on three legs of the cross member 204 within the motor wheel. The modules 205 form a three-phase power converter which further comprises a first conductive bus having a pole 209 connected to one of the DC terminals of each module 205 with a feed-trough connector 211 on one side of the cross member 204. There is a second conductive bus having a pole (not shown but similar to pole 209 with connectors similar to connectors 211) connected the other of the DC terminals of each module on the other side of the cross member 204. The two conductive bus delimit spaces between adjacent modules that are filled with the conductive material of the cross member 204. The two conductive bus are separated from the module housing and the cross member 204 by insulating material 210, whereby, in operation, an electric current is magnetically induced in the cross member 204 to suppress the magnetic flux change generated in the stray interconnection inductance present between the modules.

The machine is a three-phase permanent magnet AC machine. Three modules 205, each containing one half bridge power converter, one for each phase, are mounted on the legs of the cross member 204. There is one module per leg. Each leg acts as a heat exchanger for the corresponding module. The bipolar DC voltage bus provided in the hollow portion has one pole 209 connected with feed-trough connectors 211 to terminal 22 of a module such as the one shown for example in FIG. 4. All the connections are located on one side of the cross member 204. The other pole (not shown but similar to pole 209 with connectors similar to the connectors 211) of the DC voltage bus is connected to the other terminal 20 of the module of FIG. 4, all the connections being located on the other side of the cross member 204. Each pole is isolated from the conductive part of the cross member and the module housing with an insulating layer 210.

As the three modules 205 are apart, the stray inductive interconnection linking the modules 205 may cause a voltage oscillation between each module capacitor due to the fact that the load current are switched by each module and that this switching alternates from one pole to the other. In this case, the interconnection inductance has to be minimized. One known method for minimizing interconnection inductance is to connect two adjacent modules by means of two conductive strips mounted side by side and separated with a thin insulating material. To minimize interconnection inductance with the present invention, it requires that one interconnection passes from one side of the module to the other side. Here, a simpler connection is made by directly linking the modules by means of straight interconnections located alongside legs of the cross member, as shown in FIG. 27. With this setup, the volume between two adjacent interconnections and between two adjacent modules is completely filled with the conductive material, such as aluminum, of the cross member 204. Thereby a further spike killing effect is obtained by suppressing the magnetic flux changes produced by interconnection inductances present between the modules, thus, avoiding oscillation of the bus voltage between the capacitors of each module. The centre of each leg could be empty of conductive material without affecting the spike killing effect.

In summary, according to the present invention, the interconnection inductance of a power converter assembly is greatly reduced by integrating the power electronics switching devices, the DC terminals, the AC terminal and a capacitor within one package characterized with a belt-like current closed loop. The voltage spike induced in the interconnection inductance can be further reduced by adding a second belt-like closed loop, referred here as a spike killer, which surrounds the module to embrace in the belt-like transient current loop circulation generated in the module during a switching event. The reduced interconnection inductance and the spike killer allows a higher switching speed and frequency with a lower voltage spike across the switches thus improving the efficiency of the power converter.

Although the invention has been described above in detail within the framework of preferred embodiments, it should be understood that the scope of the present invention is to be determined by the appended claims.

What is claimed is:

1. A low stray interconnection inductance power converting module for converting a DC voltage into an AC voltage, comprising two DC voltage terminals for receiving the DC voltage; an AC voltage terminal for delivering the AC voltage; a half-bridge including a pair of power switching elements connected as a series totem pole between the DC voltage terminals via the AC voltage terminal; and a decoupling means for decoupling the half-bridge, the decoupling means comprising a series of at least two adjacent superimposed electrode plates separated by a dielectric material, each of the adjacent electrode plates being connected to a different one of the DC terminals; wherein:

the at least two adjacent superimposed electrode plates extend proximately in overlapping relation with the half bridge; and the electrode plates form with the two power switching elements, the DC terminals and the AC terminal, a reduced cross section belt-like closed loop conductive path.

2. A power converting module according to claim 1, comprising a base made of ceramic material, onto which the power switching elements are mounted, and wherein:

each of the power switching elements includes a row of power semiconductor devices mounted in parallel;

the AC terminal includes a central metal plate mounted on the base; and each of the two DC voltage terminals includes a lateral metal plate mounted onto the base, and a lateral upright metal wall connected between the lateral metal plate and the decoupling means, the power switching elements being connected as a series totem pole between the lateral metal plates of the DC voltage terminals via the central metal plate of the AC voltage terminal.

3. A power converting module according to claim 2, wherein the reduced cross section belt-like closed loop conductive path is formed by the central plate, the lateral metal plates, the lateral upright metal walls, the superimposed electrode plates and the power switching elements, and has a rectangular cross section.

4. A power converting module according to claim 3, further comprising drivers mounted on the base nearby the power semiconductor devices, for driving the power semiconductor devices.

5. A power converting module according to claim 4, wherein said semiconductor devices are gate capacitance controlled semiconductor devices, and wherein each of the drivers includes:
   a terminal to receive a gate signal for the corresponding semiconductor device;
   a first resistor connected between the terminal and a gate of the corresponding semiconductor device;
   a circuit segment including a voltage gate controlled switch and a second resistor connected in series, the circuit being connected in parallel to the first resistor;
   a capacitor connected between a gate of the voltage gate controlled switch and the collector of the corresponding semiconductor device for monitoring a collector voltage signal of the corresponding semiconductor device;
   a voltage clamping means connected between the gate of the voltage gate controlled switch and the terminal, whereby, in operation, the first resistor limits gate current of the corresponding semiconductor device prior to a drop of the collector voltage signal thereby limiting rise time of the collector current, and whereby, in operation, the first and second resistors limit the gate current of the corresponding semiconductor device during said drop of the collector voltage thereby limiting dropping time of collector voltage.

6. A power converting module according to claim 2, further comprising drivers mounted on the base nearby the power semiconductor devices, for driving the power semiconductor devices.

7. A power converting module according to claim 6, wherein said semiconductor devices are gate capacitance controlled semiconductor devices, and wherein each of the drivers includes:
   a terminal to receive a gate signal for the corresponding semiconductor device;
   a first resistor connected between the terminal and a gate of the corresponding semiconductor device;
   a circuit segment including a voltage gate controlled switch and a second resistor connected in series, the circuit being connected in parallel to the first resistor;
   a capacitor connected between a gate of the voltage gate controlled switch and the collector of the corresponding semiconductor device for monitoring a collector voltage signal of the corresponding semiconductor device;
   a voltage clamping means connected between the gate of the voltage gate controlled switch and the terminal, whereby, in operation, the first resistor limits gate current of the corresponding semiconductor device prior to a drop of the collector voltage signal thereby limiting rise time of the collector current, and whereby, in operation, the first and second resistors limit the gate current of the corresponding semiconductor device during said drop of the collector voltage thereby limiting dropping time of collector voltage.

8. A power converting module according to claim 2, 3, 6, 4, 7 or 5 comprising a control board for controlling the power semiconductor devices, the control board being located between the base onto which the power switching elements are mounted and the decoupling means.

9. A power converting module according to claim 1, 2, 3, 6, 4, 7 or 5, further comprising walls made of conductive material for closing open ends of the belt-like current closed loop, each of the open ends being delimited by edges of the central plate, of the lateral metal plates and of the lateral metal walls and by a lower edge of the superimposed metal plates whereby, in operation, an electric current is magnetically induced into the conductive walls to further reduce voltage spikes associated to stray interconnection inductance.

10. The combination of three power converting modules according to claim 1, 2, 3, 6, 4, 7 or 5, in a motor wheel provided with a stator frame supported by a cross member made of conductive material, wherein the three modules are mounted respectively on three legs of the cross member within the motor wheel, the modules forming a three-phase power converter which further comprises:
   a first conductive bus connecting one of the DC terminals of each module on one side of the cross member, and
   a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

11. A power converting module according to claim 1, 2, 3, 6, 4, 7 or 5, further comprising a housing including conductive walls surrounding the reduced cross section belt-like current closed loop, whereby, in operation, an electric current is magnetically induced into the conductive walls to further reduce voltage spikes associated to stray interconnection inductance.

12. The combination of three power converting modules according to claim 11, in a motor wheel provided with a stator frame supported by a cross member made of conductive material, wherein the three modules are mounted respectively on three legs of the cross member within the motor wheel, the modules forming a three-phase power converter which further comprises:
   a first conductive bus connecting one of the DC terminals of each module on one side of the cross member; and
   a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

13. A power converting module according to claim 11, wherein at least one of the conductive walls of the housing are formed by a metal deposition over insulating walls.

14. The combination of three power converting modules according to claim 13, in a motor wheel provided with a stator frame supported by a cross member made of conductive material, wherein the three modules are mounted respectively on three legs of the cross member within the motor wheel, the modules forming a three-phase power converter which further comprises:
   a first conductive bus connecting one of the DC terminals of each module on one side of the cross member; and a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

15. A power converting module according to claim 13, wherein the conductive walls of the housing are made of at least two parts connected together.

16. The combination of three power converting modules according to claim 15, in a motor wheel provided with a stator frame supported by a cross member made of conductive material, wherein the three modules are mounted respectively on three legs of the cross member within the motor wheel, the modules forming a three-phase power converter which further comprises:
  a first conductive bus connecting one of the DC terminals of each module on one side of the cross member; and
  a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

17. A power converting module according to claim 13, further comprising a capacitor connected between the conductive walls of the housing and one DC terminal, the conductive walls providing one connecting point for electrical connection purpose.

18. The combination of three power converting modules according to claim 17, in a motor wheel provided with a stator frame supported by a cross member made of conductive material, wherein the three modules are mounted respectively on three legs of the cross member within the motor wheel, the modules forming a three-phase power converter which further comprises:
  a first conductive bus connecting one of the DC terminals of each module on one side of the cross member; and
  a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

19. A power converting module according to claim 17, wherein the capacitor is formed by a wall of the conductive walls that is adjacent to a top electrode plate of the decoupling means, and that is separated from the top electrode plate by means of dielectric material.

20. The combination of three power converting modules according to claim 19, in a motor wheel provided with a stator frame supported by a cross member made of conductive material, wherein the three modules are mounted respectively on three legs of the cross member within the motor wheel, the modules forming a three-phase power converter which further comprises:
  a first conductive bus connecting one of the DC terminals of each module on one side of the cross member; and
  a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

21. A power converting module according to claim 11, wherein the conductive walls of the housing are made of at least two parts connected together.

22. A power converting module according to claim 21, further comprising a capacitor connected between the conductive walls of the housing and one DC terminal, the conductive walls providing one connecting point for electrical connection purpose.

23. The combination of three power converting modules according to claim 22, in a motor wheel provided with a stator frame supported by a cross member made of conductive material, wherein the three modules are mounted respectively on three legs of the cross member within the motor wheel, the modules forming a three-phase power converter which further comprises:
  a first conductive bus connecting one of the DC terminals of each module on one side of the cross member; and
  a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

24. A power converting module according to claim 22, wherein the capacitor is formed by a wall of the conductive walls that is adjacent to a top electrode plate of the decoupling means, and that is separated from the top electrode plate by means of dielectric material.

25. The combination of three power converting modules according to claim 24, in a motor wheel provided with a stator frame supported by a cross member made of conductive material, wherein the three modules are mounted respectively on three legs of the cross member within the motor wheel, the modules forming a three-phase power converter which further comprises:
  a first conductive bus connecting one of the DC terminals of each module on one side of the cross member; and
  a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

26. The combination of three power converting modules according to claim 21, in a motor wheel provided with a stator frame supported by a cross member made of conductive material, wherein the three modules are mounted respectively on three legs of the cross member within the motor wheel, the modules forming a three-phase power converter which further comprises:

a first conductive bus connecting one of the DC terminals of each module on one side of the cross member; and a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

27. A power converting module according to claim 11, further comprising a capacitor connected between the conductive walls of the housing and one DC terminal, the conductive walls providing one connecting point for electrical connection purpose.

28. The combination of three power converting modules according to claim 27, in a motor wheel provided with a stator frame supported by a cross member made of conductive material, wherein the three modules are mounted respectively on three legs of the cross member within the motor wheel, the modules forming a three-phase power converter which further comprises:

a first conductive bus connecting one of the DC terminals of each module on one side of the cross member; and a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

29. A power converting module according to claim 27, wherein the capacitor is formed by a wall of the conductive walls that is adjacent to a top electrode plate of the decoupling means, and that is separated from the top electrode plate by means of dielectric material.

30. The combination of three power converting modules according to claim 29, in a motor wheel provided with a stator frame supported by a cross member made of conductive material, wherein the three modules are mounted respectively on three legs of the cross member within the motor wheel, the modules forming a three-phase power converter which further comprises:

a first conductive bus connecting one of the DC terminals of each module on one side of the cross member; and a second conductive bus connecting the other of the DC terminals of each module on the other side of the cross member, the two conductive bus delimiting spaces between adjacent modules that are filled with the conductive material of the cross member, the two conductive bus and the cross member being separated by insulating material, whereby, in operation, an electric current is magnetically induced in the cross member to suppress the voltage oscillations on the capacitor of each module due to the stray interconnection inductance present between the modules.

31. A method for converting a DC voltage into an AC voltage, comprising:

applying the DC voltage on two DC voltage terminals between which a half bridge is connected, the half bridge including a pair of power switching elements connected as a series totem pole between the DC voltage terminals via an AC voltage terminal;

alternately switching the power switching elements;

decoupling the half bridge by means of a decoupling means comprising a series of at least two adjacent superimposed electrode plates separated by a dielectric material and extending proximately in overlapping relation with the half bridge, each of the adjacent electrode plates being connected to a different one of the DC terminals, the electrode plates forming with the two power switching elements, the DC terminals and the AC terminal. reduced cross section belt like current closed loop; and delivering the AC voltage by means of the AC voltage terminal.

32. A method according to claim 31, comprising the additional step of surrounding the reduced cross section belt like current closed loop by means of a housing including conductive walls, whereby, in operation, an electric current is magnetically induced into the conductive walls to further reduce voltage spikes associated to stray interconnection inductance.

* * * * *

UNITED STATES PATENT AND TRADEMARK OFFICE
CERTIFICATE OF CORRECTION

PATENT NO. : 6,954,368 B1
DATED : October 11, 2005
INVENTOR(S) : Bruno Francoeur et al.

It is certified that error appears in the above-identified patent and that said Letters Patent is hereby corrected as shown below:

<u>Title page, Item [54] and Column 1, lines 1-5,</u>
Title, should read -- LOW STRAY INTERCONNECTION INDUCTANCE POWER CONVERTING MODULE FOR CONVERTING A DC VOLTAGE INTO AN AC VOLTAGE, AND A METHOD THEREFOR --.

Signed and Sealed this

Thirty-first Day of January, 2006

JON W. DUDAS
*Director of the United States Patent and Trademark Office*